United States Patent [19]
Ohba

[11] Patent Number: 5,369,619
[45] Date of Patent: Nov. 29, 1994

[54] SEMICONDUCTOR MEMORY DEVICE READING/WRITING DATA OF MULTIPLE BITS INTERNALLY

[75] Inventor: Atsushi Ohba, Hyogo, Japan

[73] Assignee: Mitsubishi Denki Kabushiki Kaisha, Tokyo, Japan

[21] Appl. No.: 780,582

[22] Filed: Oct. 22, 1991

[30] Foreign Application Priority Data

Oct. 24, 1990 [JP] Japan .................. 2-287890

[51] Int. Cl.⁵ .................. G11C 7/00; G11C 11/34
[52] U.S. Cl. .................. 365/230.03; 365/230.06; 365/238.5; 365/230.01; 365/63
[58] Field of Search .................. 365/230.03, 230.06, 365/230.01, 238.5, 63

[56] References Cited

U.S. PATENT DOCUMENTS

| | | | |
|---|---|---|---|
| 4,854,677 | 7/1989 | Chappell et al. | 365/230.03 |
| 4,958,326 | 9/1990 | Sakurai | 365/230.03 |
| 5,150,330 | 9/1992 | Hag | 365/230.03 |

FOREIGN PATENT DOCUMENTS

| | | |
|---|---|---|
| 59-49706 | 12/1984 | Japan . |
| 61-190786 | 8/1986 | Japan . |
| 62-28516 | 6/1987 | Japan . |
| 62-142348 | 6/1987 | Japan . |
| 62-149095 | 7/1987 | Japan . |
| 62-149096 | 7/1987 | Japan . |
| 62-149097 | 7/1987 | Japan . |
| 2-101697 | 4/1990 | Japan . |

Primary Examiner—Viet Q. Nguyen
Attorney, Agent, or Firm—Lowe, Price, LeBlanc & Becker

[57] ABSTRACT

A semiconductor memory device includes a memory cell array divided into a plurality of block. In one region on the memory chip, four blocks, two input/output circuits, and two data buses are arranged. In the other region on the chip, four blocks, two input/output circuits, and two data buses are arranged. Each block in each region is divided into two sub-blocks corresponding to the two input/output circuits. Each data bus is connected between the corresponding input/output circuit in the same region and the corresponding two sub-blocks.

3 Claims, 21 Drawing Sheets

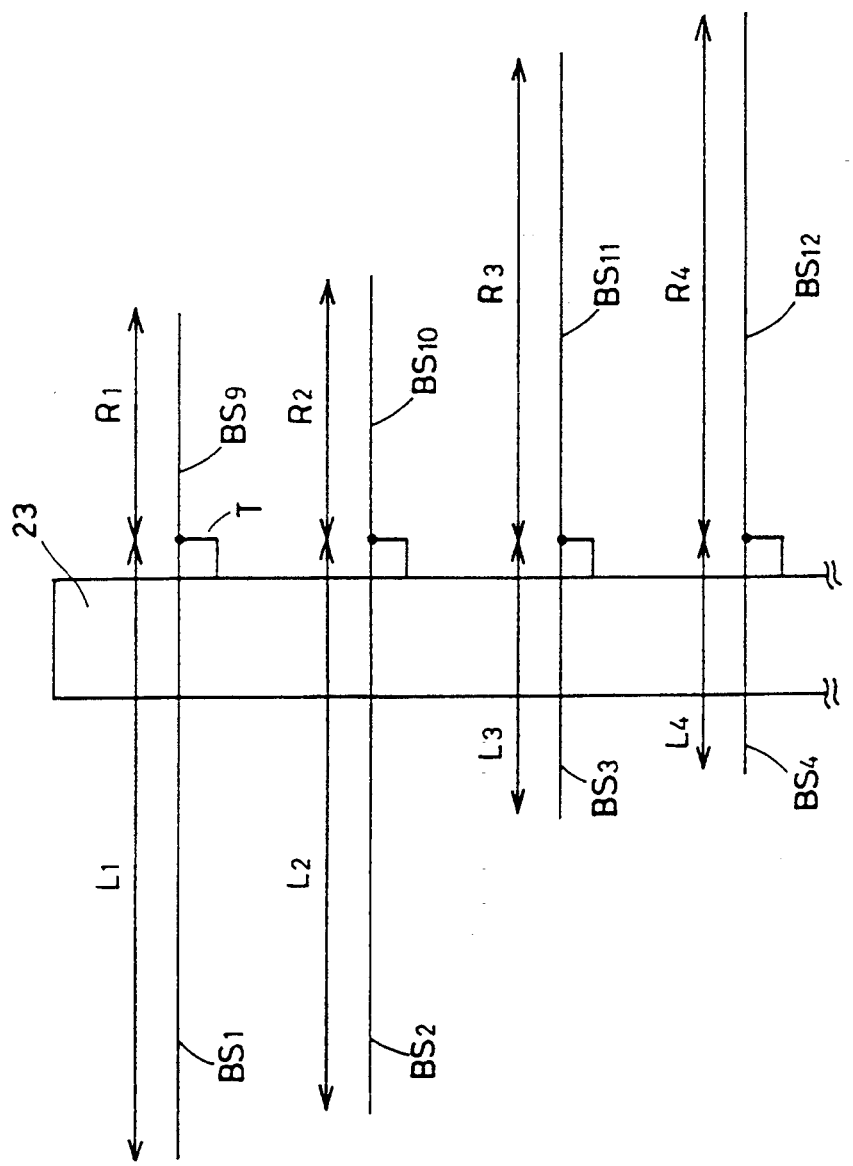

SEMICONDUCTOR MEMORY DEVICE READING/WRITING DATA OF MULTIPLE BITS INTERNALLY

BACKGROUND OF THE INVENTION

1. Field of the Invention

The present invention relates to semiconductor memory devices, and more particularly, to a semiconductor memory device including a plurality of memory array blocks.

2. Description of the Background Art

FIG. 13 is a circuit diagram of a portion of a conventional static random access memory (referred to as a SRAM hereinafter). This semiconductor memory device is disclosed in Japanese Patent Laying-Open No. 61-190786.

Referring to FIG. 13, a memory cell array 10 comprises a plurality of word lines WL, a plurality of bit line pairs BL, $\overline{BL}$ crossing word line WL, and a plurality of memory cells MC provided in the crossings thereof. Memory cell array 10 has a structure of four rows and four columns. Each bit line pair BL, $\overline{BL}$ is connected to a first voltage supply line V1 via bit line load transistors Q11 and Q12. Each bit line pair BL, $\overline{BL}$ is connected to input/output line pair I/O, $\overline{I/O}$ via transfer gate transistors Q13, Q14.

An X decoder 20 is responsive to an X address signal to provide a signal for activating word line selecting circuit 40. Word line selecting circuit 40 comprises a plurality of NOR gates G2 corresponding to the plurality of word lines WL. The output of each NOR gate G2 is provided to the corresponding word line WL. A Y decoder 30 is responsive to a Y address signal to provide a signal to activate a bit line selecting circuit 60. Bit line selecting circuit 60 comprises a plurality of NOR gates G3 corresponding to the plurality of bit line pairs BL, $\overline{BL}$. The output of each NOR gate G3 is provided to the gates of the corresponding transfer gate transistors Q13, Q14.

Input/output line pair I/O, $\overline{I/O}$ is connected to local sense amplifier LSA of the differential amplification type and a write driver WD. Local sense amplifier LSA and write driver WD form a read/write amplifying circuit 50.

Local sense amplifier LSA comprises bipolar transistors Q21, Q22 and an N channel MOS transistor Q23. Local sense amplifier LSA is responsive to the output of sense amplifier selecting circuit 70 to be activated for detecting and amplifying the potential difference between input/output line pair I/O and $\overline{I/O}$. The amplified potential difference is provided to read data buses Ra, Rb.

Write driver WD comprises N channel MOS transistors Q31–Q34. Transistor Q31 is connected between the first voltage supply line V1 and input/output line $\overline{I/O}$. Transistor Q33 is connected between the first voltage supply line V1 and input/output line I/O. Transistor Q32 is connected between a second voltage supply line V2 and input/output line I/O. Transistor Q34 is connected between the second voltage supply line V2 and input/output line $\overline{I/O}$. Transistors Q31 and Q34 have their gates connected to write data bus Wa. Transistors Q32 and Q33 have their gates connected to write data bus Wb. Write data buses Wa and Wb are supplied with the output of write amplifier 80.

An output circuit 90 is connected to read data buses Ra, Rb. Output circuit 90 comprises a clamp potential generating circuit CL, a main sense amplifier MSA of the current detection type, and an ECL level output circuit OC.

Clamp potential generating circuit CL comprises a diode D1, a bipolar transistor Q41, and a resistor R1. Diode D1 is connected between first voltage supply line V1 and the collector of transistor Q41. The base of transistor Q41 is supplied with reference potential VR for constant current generation. The emitter of transistor Q41 is connected to second voltage supply line V2 via resistor R1. Transistor Q41 and resistor R1 form a constant current source.

Main sense amplifier MSA comprises transistors Q42 and Q43 for read data bus clamping, emitter follower transistors Q44 and Q45, diodes D2 and D3 for level shifting, resistors R2 and R3, and constant current sources CS1-CS4. Transistors Q42, Q43 have their collectors connected to first voltage supply line V1 via resistors R2 and R3, respectively. The output of clamp potential generating circuit CL is provided to the bases of transistors Q42 and Q43. The emitter of transistor Q42 is connected to read data bus Rb and constant current source CS1. The emitter of transistor Q43 is connected to read data bus Ra and constant current source CS2. Transistors Q44 and Q45 have their bases supplied with the outputs of resistors R2 and R3, respectively. The emitter of transistor Q44 is connected to constant current source CS3 via diode D2. The emitter of transistor Q45 is connected to constant current source CS4 via diode D3.

ECL level output circuit OC comprises bipolar transistors Q51–Q54 and resistors R4, R5. The base of transistor Q51 is supplied with the output of diode D3. The base of transistor Q52 is supplied with the output of diode D2. The base of transistor Q53 is supplied with reference potential VR. Data output is obtained from the emitter of transistor Q54.

FIGS. 14 and 15 are circuit diagrams showing examples of the structures of a memory cell MC. FIG. 14 shows a high resistance load type NMOS memory cell. FIG. 15 shows a CMOS type memory cell.

The memory cell of FIG. 14 comprises N channel MOS transistors Q1–Q4 and load resistors R6 and R7. Complementary data are held in nodes N1 and N2.

The memory cell of FIG. 15 comprises N channel MOS transistors Q1–Q4 and P channel MOS transistors Q5 and Q6. Similarly, complementary data are held in nodes N1 and N2 in this memory cell.

FIG. 16 is a circuit diagram showing the main components of FIG. 13. The operation of the SRAM of FIG. 13 will be explained hereinafter with reference to FIG. 16.

When a signal of low level is applied to the two input terminals of one of NOR gates G2 in word line selecting circuit 40 from X decoder 20, the potential of word line WL attains a high level. At this time, a signal of high level is applied to at least one of the two input terminals of the other NOR gates G2 in word line selecting circuit 40. Accordingly, the potentials of the other word lines WL are at a low level. A signal of low level is applied to the two input terminals of one of NOR gates G3 in bit line selecting circuit 60 from Y decoder 30. The output of that NOR gate G3 attains a high level, whereby the corresponding transfer gate transistors Q13 and Q14 are turned on. As a result, one of the memory cells MC is selected.

It is assumed that the potential of node N1 in memory cell MC is held at a high level, and the potential of node N2 is held at a low level. Transistor Q1 is non conductive, and transistor Q2 is conductive at this time.

At the time of data reading, the outputs of write amplifier 80 are both fixed at the low level. When the potential of word line WL is at a high level, transfer gate transistors Q3 and Q4 in memory cell MC are both conductive.

Assume that the potential of first voltage supply line V1 is ground potential (=0 V), and the potential of second voltage supply line V2 is $V_{EE}$ (−5.2 V when ECL 10 K). Because N channel MOS transistor is used as a load, potential $V_{B1}$ of bit line BL attains a level lower than ground potential by threshold voltage Vth of N channel MOS transistor. Accordingly, $$V_{B1} = -Vth$$

Potential $V_{B2}$ of bit line $\overline{BL}$ is reduced by $\Delta V$ due to the ON resistance of bit line load transistor Q12. Therefore, $$V_{B2} = -Vth - \Delta V$$

$\Delta V$ is called the bit line voltage swing, which is normally 50 mV to 500 mV. This bit line amplitude is adjusted by the size of the bit line load transistor.

The bit line voltage swing appears on input/output line pair I/O, $\overline{I/O}$ via transfer gate transistors Q13 and Q14. This bit line voltage swing is amplified by local sense amplifier LSA to be provided to read data buses Ra and Rb as current output. Since the potentials of bit lines BL and $\overline{BL}$ are at a high level $V_{b1}$ and a read low level $V_{B2}$, respectively, at this time, the potentials of input/output lines I/O and $\overline{I/O}$ are at a high level and a read low level, respectively. Therefore, only transistor Q21 conducts, whereby sense current flows through read data bus Ra. Current does not flow through read data bus Rb.

The potentials of read data buses Ra and Rb are clamped at a constant clamp potential $V_{CL}$ by clamp potential generating circuit CL and clamp transistors Q42 and Q43. Clamp potential $V_{CL}$ is defined by the output potential $(-V_D)$ of clamp potential generating circuit CL and voltage $V_{BE}$ between the bases and emitters of clamp transistors Q42 and Q43, expressed as follows.

$$V_{CL} = -V_D - V_{BE}$$

In main sense amplifier MSA, sense current flows to resistor R3 through clamp transistors Q43. Therefore, the output of resistor R3 is lower in voltage than the output of resistor R2 by sense current. Accordingly, potential of a low level is provided from resistor R3.

The potential difference between the outputs of resistors R2 and R3 is provided to ECL level output circuit OC via emitter follower transistors Q44, Q45 and level shift diodes D2, D3. Data of ECL level is provided by ECL level output circuit OC. Thus, the read operation is carried out.

At the time of data writing, potential of one bit line is pulled to a write low level ($V_{EE}$), and the potential of the other bit line is pulled up to a high level. In the case of writing an inverted data to memory cell MC in FIG. 16, the potential of write data bus Wa is brought to a low level by write amplifier 80, and the potential of write data bus Wb is turned to a high level. This causes transistors Q31 and Q34 in write driver WD to go into non-conduction, and transistors Q32 and Q33 to go into conduction. Accordingly, the potential of input/output line $\overline{I/O}$ attains a low level, and the potential of input/output line I/O attains a high level. As a result, the potential of bit line BL attains a low level, and the potential of bit line $\overline{BL}$ attains a high level. Thus, the writing operation is carried out.

In the above described SRAMs, a structure of dividing the memory array into a plurality of blocks is employed using divided word line techniques to comply with increase in integration density. This divided word line technique is disclosed in Japanese Patent Publication No. 62-28516, for example.

For the purpose of reducing the number of bit line pairs connected to the same input/output line pair for preventing the access time from increasing, and for the purpose of simplifying the switching of the data organization on the same chip (for example, 1 bit organization and 4 bit organization), each block is divided into 4–16 sub-blocks, with 4–16 local sense amplifiers disposed corresponding to the 4–16 sub-blocks. By multiplexing the outputs of these local sense amplifiers, data output of 1 bit can be obtained.

FIGS. 17–21 are block diagrams showing an example of a semiconductor memory device having a memory cell array divided into the above-described blocks and sub-blocks. In this embodiment, the memory cell array is divided into 8 blocks, where each block is further divided into 4 sub-blocks.

Referring to the semiconductor memory device of FIG. 17, an X decoder 2 acting as a main word line driving circuit is disposed at the end of a memory cell array 1a.

Memory cell array 1a is divided into 8 blocks BK1–BK8 using the divided word line technique. Each block is divided into four sub-blocks S0–S3. Four read/write amplifying circuits A0–A3 are disposed corresponding to the four sub-blocks S0–S3. The read/write amplifying circuit comprises local sense amplifier LSA and write driver WD shown in FIG. 13.

Eight word line selecting circuits 41–48 are provided corresponding to the eight blocks of BK1–BK8. A block selector 3a is disposed at one side of memory cell array 1a. The output signals of block selector 3a are applied to word line selecting circuits 41–48 via the respective block selecting lines BS1–BS8.

At the other side of memory cell array 1a, four input/output circuits IO0–IO3 corresponding to a 4-bit data are disposed. The four read/write amplifying circuits A0–A3 corresponding to each of blocks BK1–BK8 are connected to four input/output circuits IO0–IO3 via four sets of read/write data buses (referred to as data buses hereinafter) RW0–RW3.

To simplify the drawing, Y decoder 30 and bit line selecting circuit 60 (refer to FIG. 13) are omitted.

The operation of the semiconductor memory device of FIG. 17 will be explained briefly. The operation of the circuit of the Y address system is referred to that regarding FIG. 13, and will be not repeated here.

In a semiconductor memory device using the divided word line technique, only one of the plurality of blocks is activated by the output signal of block selector 3a. Referring to FIG. 17, one of the plurality of output signals of X decoder 2 and one of the plurality of output signals of block selector 3a are selected. The combination of these two output signals select one word line (local word line) in one block.

Consider a case where block BK1, for example, is selected. The signal of block selecting line BS1 is activated by block selector 3a. Also, one of the plurality of output signals of X decoder 2 is activated. As a result, one local word line in block BK1 is driven. This selects a plurality of memory cells connected to that local word line.

At this time, read/write amplifying circuits A0–A3 corresponding to block BK1 are activated. Read/write amplifying circuits A0–A3 corresponding to the other blocks BK2–BK8 are not activated. As a result, read/write operation of data is carried out via data buses RW0–RW3 between read/write amplifying circuits A0–A3 corresponding to block BK1 and input/output circuits IO0–IO3.

Only one block in the memory cell array divided into a plurality of blocks is activated to carry out read/write operation in a semiconductor memory device using the divided word line technique.

Referring to the semiconductor memory device of FIG. 18, an X decoder is disposed in the center of memory cell array 1a. Blocks BK1–BK4 are disposed at one side, and blocks BK5–BK8 are disposed at the other side.

Referring to the semiconductor memory device of FIG. 19, memory cell array 1a is divided into two by dividing each bit line pair at the center. X decoders 2a and 2b are arranged in the center of memory cell array 1a. Blocks BK1, BK2 are disposed at one side of X decoder 2a, and blocks BK5, BK6 are disposed at the other side. Blocks BK3, BK4 are disposed at one side of X decoder 2b, and blocks BK7, BK8 are disposed at the other side.

Referring to the semiconductor memory device of FIG. 20, X decoder 2 is disposed at one end of memory cell array 1a. A block selector 3a is disposed at the other end.

Referring to the semiconductor memory device of FIG. 21, an X decoder·block selector 23a including an X decoder and a block selector is disposed in the middle of memory cell array 1a. Blocks BK1–BK4 are arranged at one side of X decoder·block selector 23a, and blocks BK5–BK8 are disposed at the other side.

The structures of the components in the semiconductor memory devices of FIGS. 18–21 are similar to those in the semiconductor memory device of FIG. 17. Only the arrangement of the components differs. The operation of the semiconductor memory devices of FIGS. 18–21 is similar to that of the semiconductor memory device of FIG. 17.

In the semiconductor memory devices of FIG. 17–21, data buses RW0–RW3 are arranged along the direction of the longer side of chip CH. This is responsible for the lengthy wiring of data buses RW0–RW3. The load capacitance of each data bus is also increased. This leads to a problem that the delay time of the signals in data buses RW0–RW3 is increased.

In order to reduce the wiring length of each read data bus, a method of dividing each read data bus into a plurality of wiring portions is employed, as disclosed in Japanese Patent Laying-Open No. 2-101697, for example.

However, this method will result in increase in the width of the wiring region for the data bus if the data organization (bit width) is increased, such as to a 4-bit organization, an 8-bit organization, a 16-bit organization. Two wirings are respectively necessary for each read data bus and each write data bus. In the case of 16-bit organization, a total of 64 wirings will be arranged along the longer side of the chip. This yields a second problem that a large wiring region is necessary on the chip.

If the block selector is arranged in a direction identical to the X decoder, as in the semiconductor memory devices of FIGS. 20 and 21, the length of block selecting lines BS1–BS8 transmitting the output signal of the block selector depends on the distance to the block to be driven. This results in difference in the wiring length between block selecting lines BS1–BS8. This difference in wiring length causes great difference in the load capacitance of the block selecting line. This will cause skew of the output signals of the block selector in the semiconductor memory device.

Referring to FIG. 22, there is a skew time t1 between the potential of block selecting line BS5 dropping from a high level to a low level and the potential of block selecting line BS1 attaining a high level from a low level. This means that there is a time period where no memory cell is selected in the blocks.

Referring to FIG. 23, there is a time period t2 where the potential of block selecting line BS1 and the potential of block selecting line BS5 both are at a high level. This causes a double or multi-selection state where memory cells in a plurality of blocks are selected at the same time.

This causes erroneous writing at the time of data writing. The access time at data reading will also be increased.

SUMMARY OF THE INVENTION

An object of the present invention is to reduce the delay time of a signal on a data bus, and to reduce the wiring region of a data bus in a semiconductor memory device.

Another object of the present invention is to prevent erroneous operation due to signal skew on a block selecting line.

A semiconductor memory device according to the present invention includes a plurality of memory array blocks, a plurality of input/output circuits, a plurality of data buses, and a selecting circuit.

Each of the plurality of memory array blocks includes a plurality of memory cells. The plurality of input/output circuits are provided corresponding to the plurality of bits for data input/output. The plurality of data buses are provided corresponding to the plurality of input/output circuits.

Each of the plurality of memory array blocks is provided in any one of the plurality of regions. Each of the plurality of input/output circuits and the corresponding data bus are provided in any one of the plurality of regions. Each of the plurality of memory array blocks includes one or more sub-blocks corresponding to one or more input/output circuits in the same region. Each of the plurality of data buses is connected between the corresponding input/output circuit in the same region and the corresponding sub-blocks in the plurality of memory array blocks in the same region.

The selecting circuit selects simultaneously any one of the plurality of memory arrays in each of the plurality of regions for reading/writing data of a plurality of bits.

This semiconductor memory device has each memory array block divided into a plurality of sub-blocks.

The number of sub-blocks is identical to the number of the input/output circuits in the same region. Each data bus is connected between the corresponding input/output circuit in the same region and the corresponding sub-blocks. Any one of the plurality of memory array blocks is selected simultaneously in each region. This selects a plurality of sub-blocks for reading/writing data of a plurality of bits corresponding to the plurality of input/output circuits.

Because the plurality of data buses are allocated to a plurality of regions on the semiconductor chip, the length of each data bus is reduced. This results in a smaller capacitance of each data bus to reduce the delay time of a signal. Also, the region of the data bus is reduced.

A semiconductor memory device having the delay time of a signal reduced by decrease in interconnection capacitance and having a smaller area can be obtained.

A semiconductor memory device according to another aspect of the present invention includes a plurality of first memory array blocks, a plurality of second memory array blocks, a selecting circuit, and a plurality of block selecting lines.

The plurality of first memory array blocks are provided on a first region, each including a plurality of memory cells. The plurality of second memory array blocks are provided on a second region, each including a plurality of memory cells. The selecting circuit is disposed between the first region and the second region to select any one of the plurality of first memory array blocks and any one of the plurality of second memory array blocks simultaneously. The plurality of block selecting lines transmits the output from the selecting circuit to the plurality of first and second memory array blocks.

Each of the plurality of block selecting lines is connected between the selecting circuit and any one of the plurality of first memory array blocks, and between the selecting circuit and any one of the plurality of second memory array blocks so that the lengths of the plurality of block selecting lines are equal.

This semiconductor memory device does not have difference in capacitance between the block selecting lines because the length of the respective block selecting lines is equal. There is no difference in the delay time of the output signal of the selecting circuit transmitted through the plurality of block selecting lines.

This eliminates the time period where no memory array block is selected. This also eliminates the problem of double or multi-selection situation where a plurality of memory cell array blocks are selected simultaneously. This prevents erroneous writing of data and lengthy access time.

A semiconductor memory device having erroneous operation prevented by equalization of the capacitance of the block selecting lines can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12A is a diagram showing the wiring length of a block selecting lines.

DESCRIPTION OF THE PREFERRED EMBODIMENTS

Figure 1:
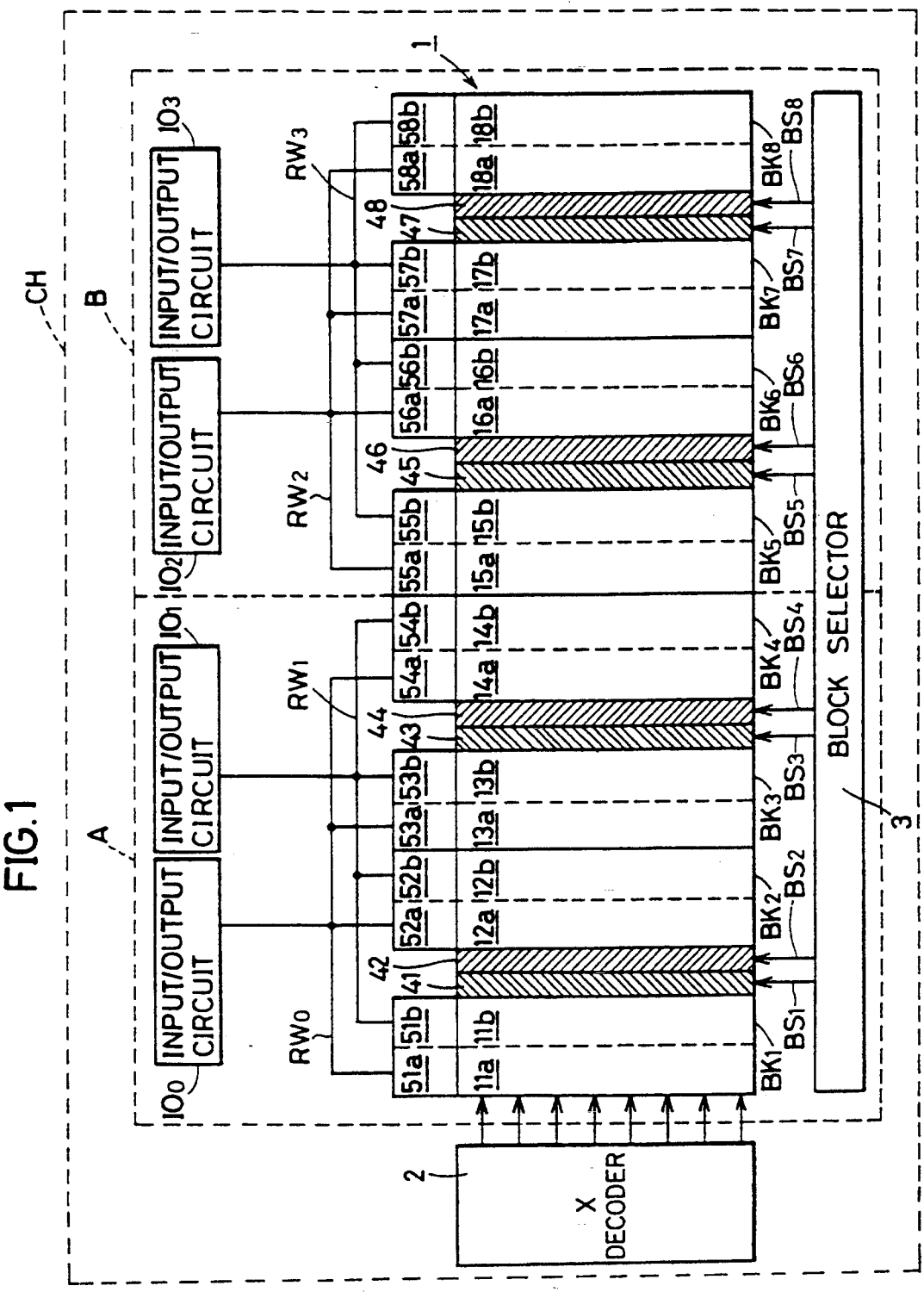
FIG. 1 is a block diagram showing the structure of the main components of a semiconductor memory device according to a first embodiment of the present invention.

Referring to FIG. 1, an X decoder 2 is disposed at one end of a memory cell array 1. A block selector 3 is disposed at one side of memory cell array 1. Memory cell array 1 is divided into 8 blocks BK1–BK8. Each block is divided into two sub-blocks. Blocks BK1–BK8 comprise sub-blocks 11a, 11b–18a, 18b, respectively. Corresponding to sub-blocks 11a, 11b–18a, 18b, read/write amplifying circuits 51a, 51b–58a, 58b are provided. Corresponding to the eight blocks BK1–BK8, eight word line selecting circuits 41–48 are provided.

At the other side of memory cell array 1, four input/output circuits IO0–IO3 are provided corresponding to a 4-bit data. Input/output circuit 100 is connected to read/write amplifying circuits 51a–54a via data bus RW0. Input/output circuit IO1 is connected to read/write amplifying circuits 51b–54b via data bus RW1.

Input/output circuit IO2 is connected to read/write amplifying circuits 55a–58a via data bus RW2. Input/output circuit IO3 is connected to read/write amplifying circuits 55b–58b via data bus RW3.

Thus, each of blocks BK1–BK4 are divided into two sub-blocks corresponding to the two input/output circuits of IO0 and IO1. Each of blocks BK5–BK8 is divided into two sub-blocks corresponding to the two input/output circuits of IO2 and IO3.

Blocks BK1–BK4, read/write amplifying circuits 51a, 51b–54a, 54b, and input/output circuits IO0, IO1 are arranged in region A on chip CH. Blocks BK5–BK8, read/write amplifying circuits 55a, 55b–58a, 58b, and input/output circuits IO2, IO3 are arranged in region B on chip CH. Accordingly, data buses RW0 and RW1 are allocated to region A, and data buses RW2 and RW3 are allocated to region B. This reduces the wiring length of each of data buses RW0–RW3. The wiring region for data buses RW0–RW3 are also reduced.

Figure 2:
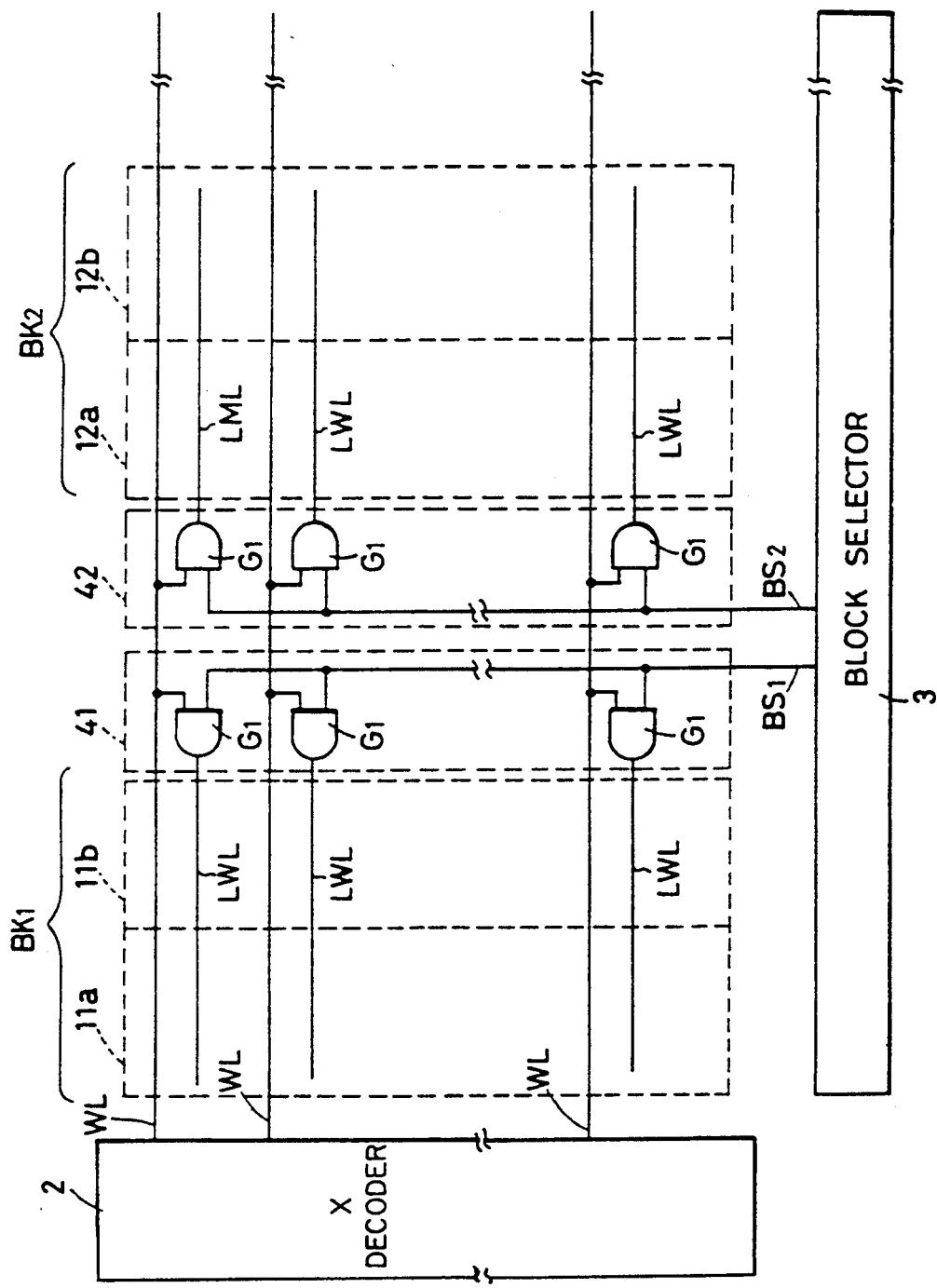
FIG. 2 is a diagram for explaining the divided word line technique.

FIG. 2 is a diagram for explaining the divided word line technique. FIG. 2 shows blocks BK1 and BK2 of FIG. 1.

X decoder 2 has a plurality of main word lines WL connected. Each main word line WL extends from one end of memory cell array 1 (FIG. 1) to the other end thereof. A plurality of local word lines LWL are disposed in each of blocks BK1 and BK2. Each of word line selecting circuits 41 and 42 include a plurality of AND gates G1 corresponding to the plurality of local word lines LWL. Word line selecting circuit 41 has one input terminal of each AND gate G1 connected to the corresponding main word line WL, and the other input terminal connected to block selecting line BS1 from block selector 3. The output terminal of each AND gate G1 is connected to the corresponding local word line LWL. Word line selecting circuit 42 has one input terminal of each AND gate G1 connected to the corresponding main word line WL, and the other input terminal connected to block selecting line BS2 from block selector 3. The output terminal of each AND gate G1 is connected to the corresponding local word line LWL.

Figure 3:
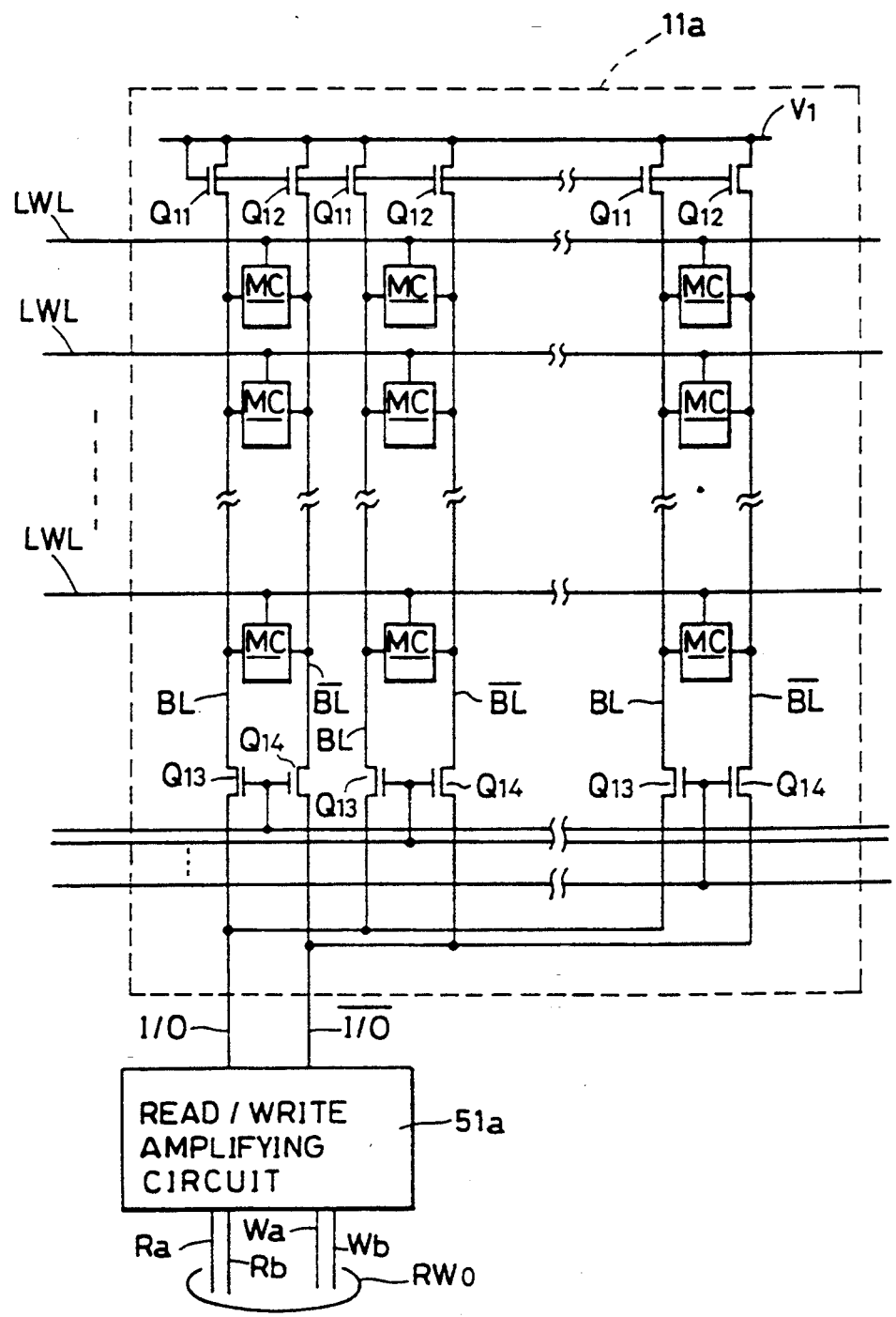
FIG. 3 is a circuit diagram showing a structure of a sub-block.

The structure of sub-block 11a in block BK1 is shown in FIG. 3. The structures of the other sub-blocks are similar to that of FIG. 3.

Figure 14:
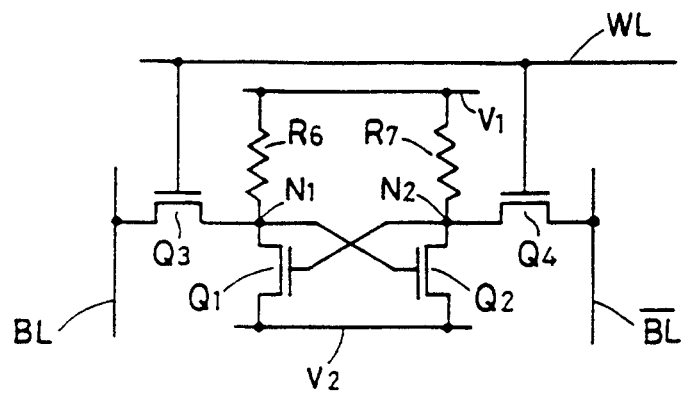
FIG. 14 is a circuit diagram showing an example of a memory cell.
Figure 15:
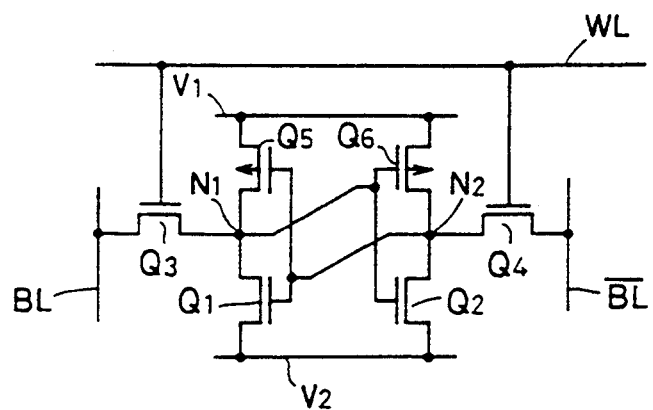
FIG. 15 is a circuit diagram showing another example of a memory cell.
Figure 16:
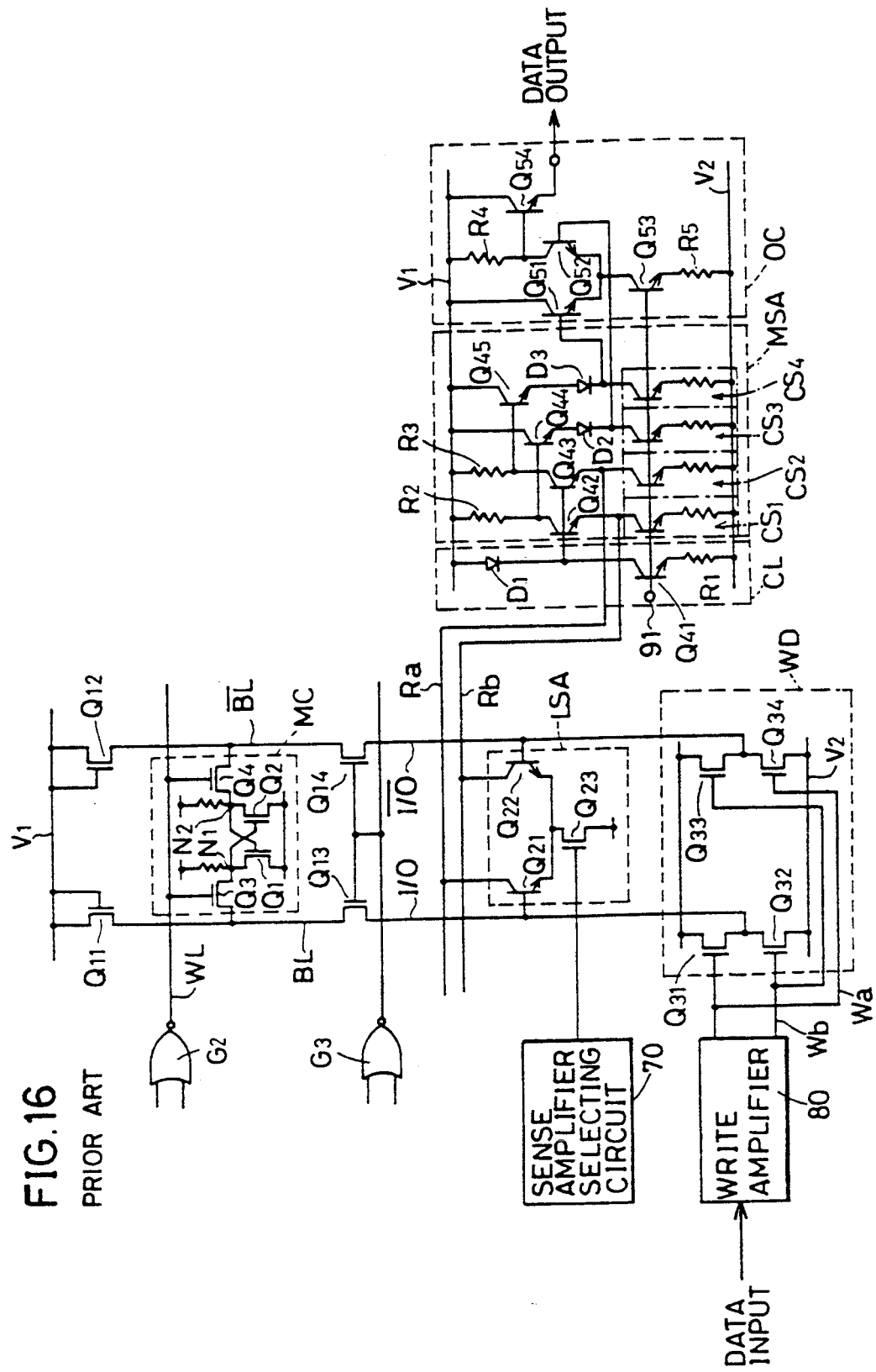
FIG. 16 is a circuit diagram showing a structure of a portion of FIG. 13.
Figure 17:
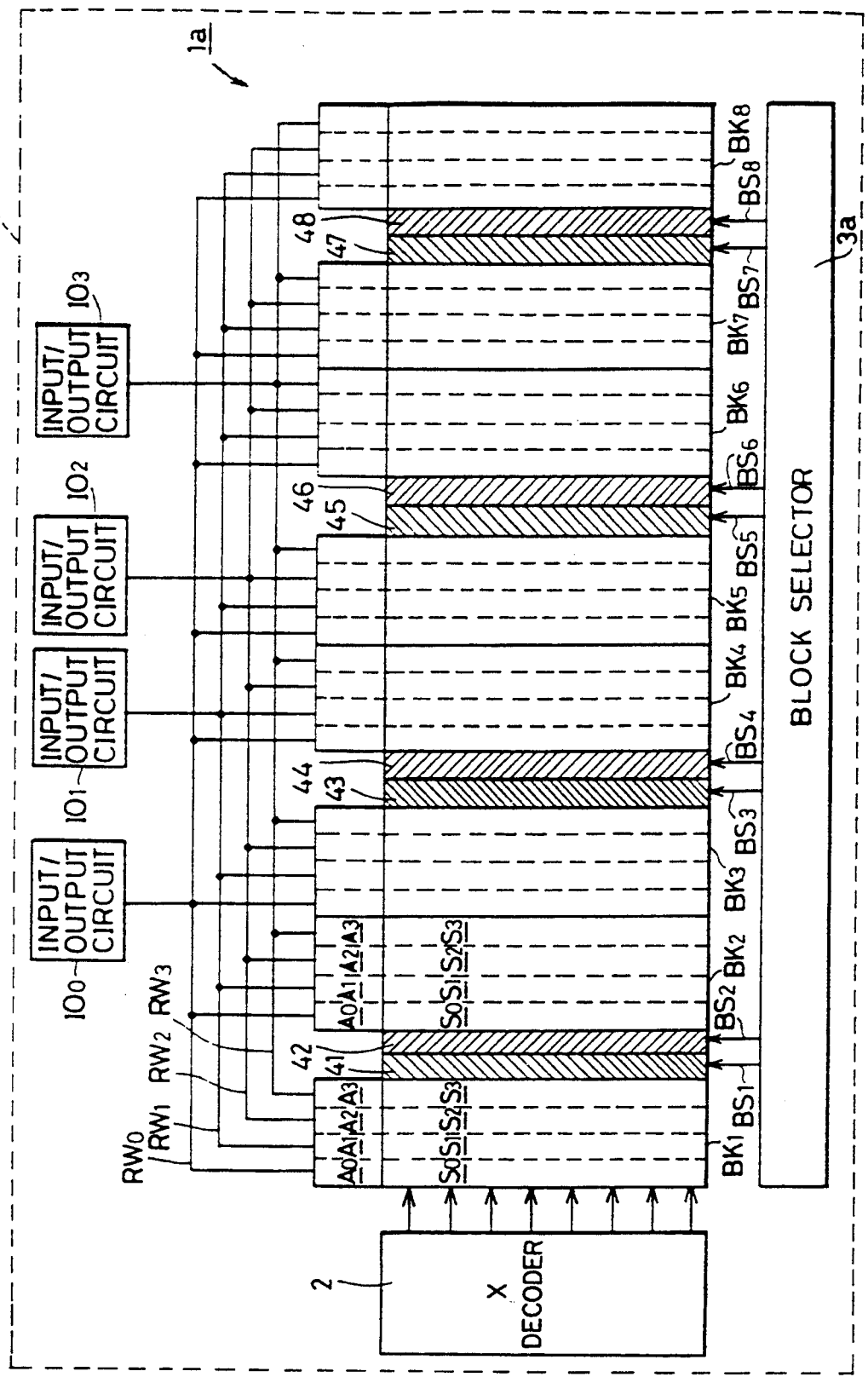
FIGS. 17–21 are block diagrams respectively showing a structure of the main components of a conventional semiconductor memory device employing the divided word line technique.
Figure 18:
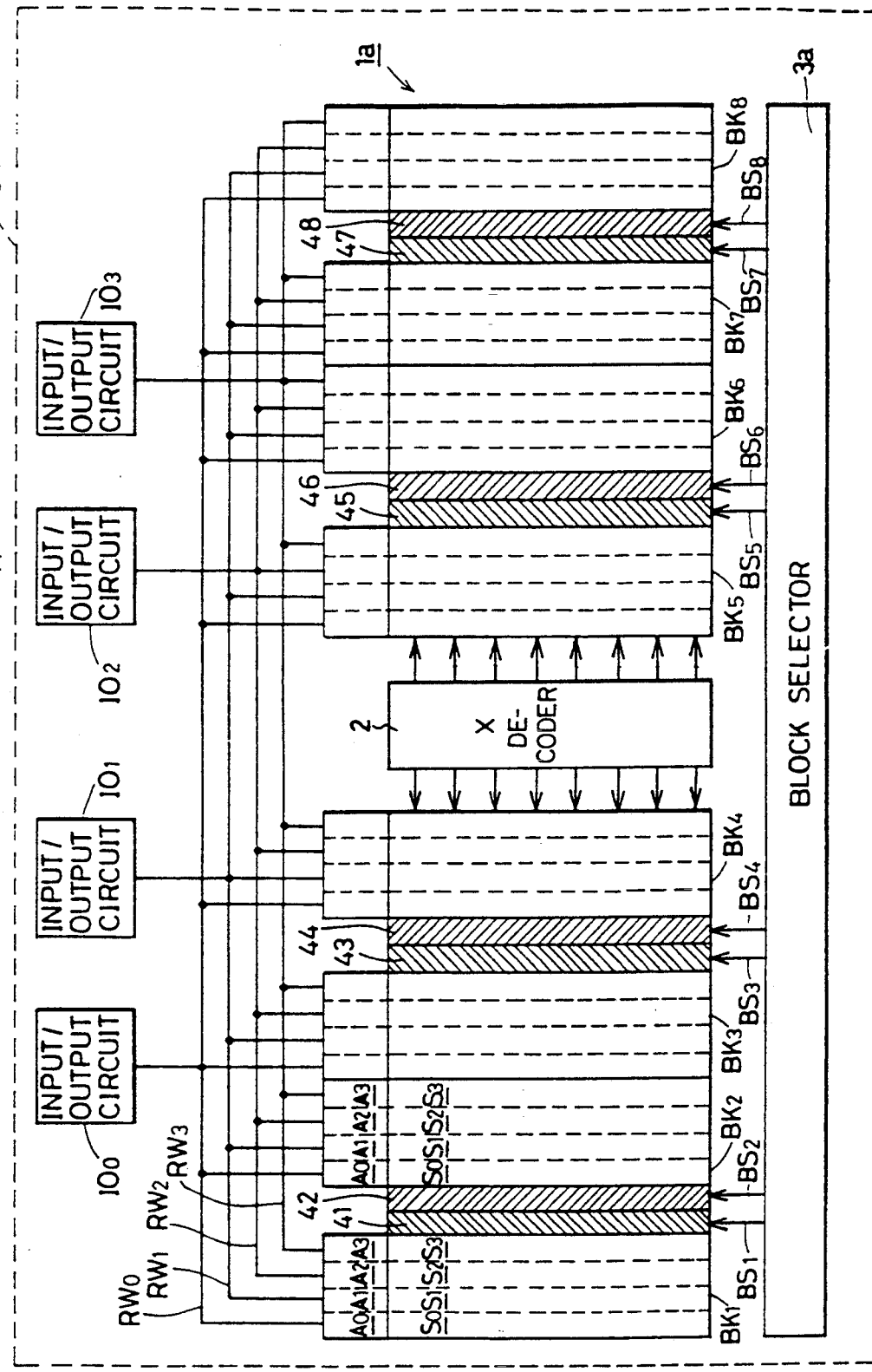
Figure 19:
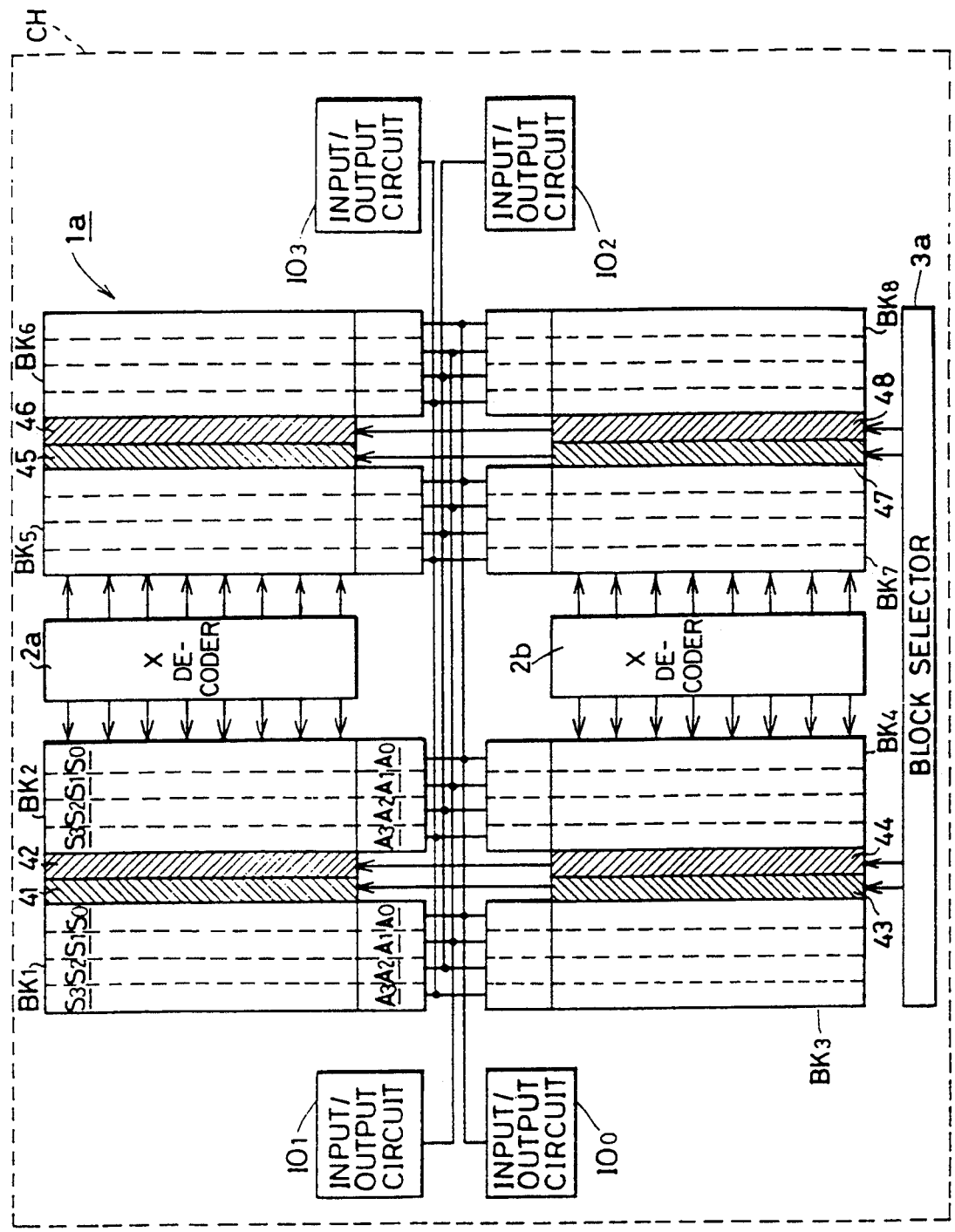
Figure 20:
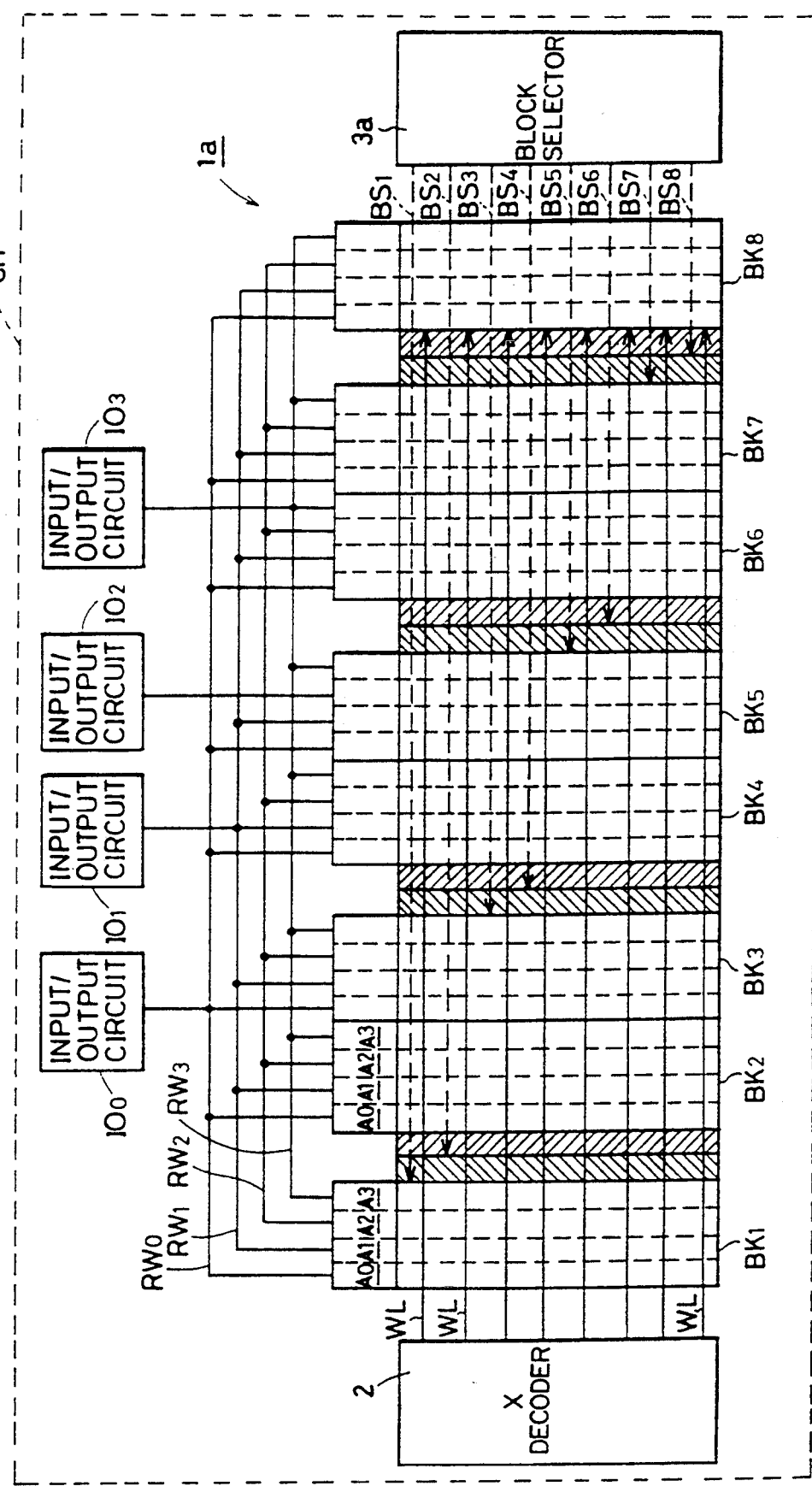
Figure 21:
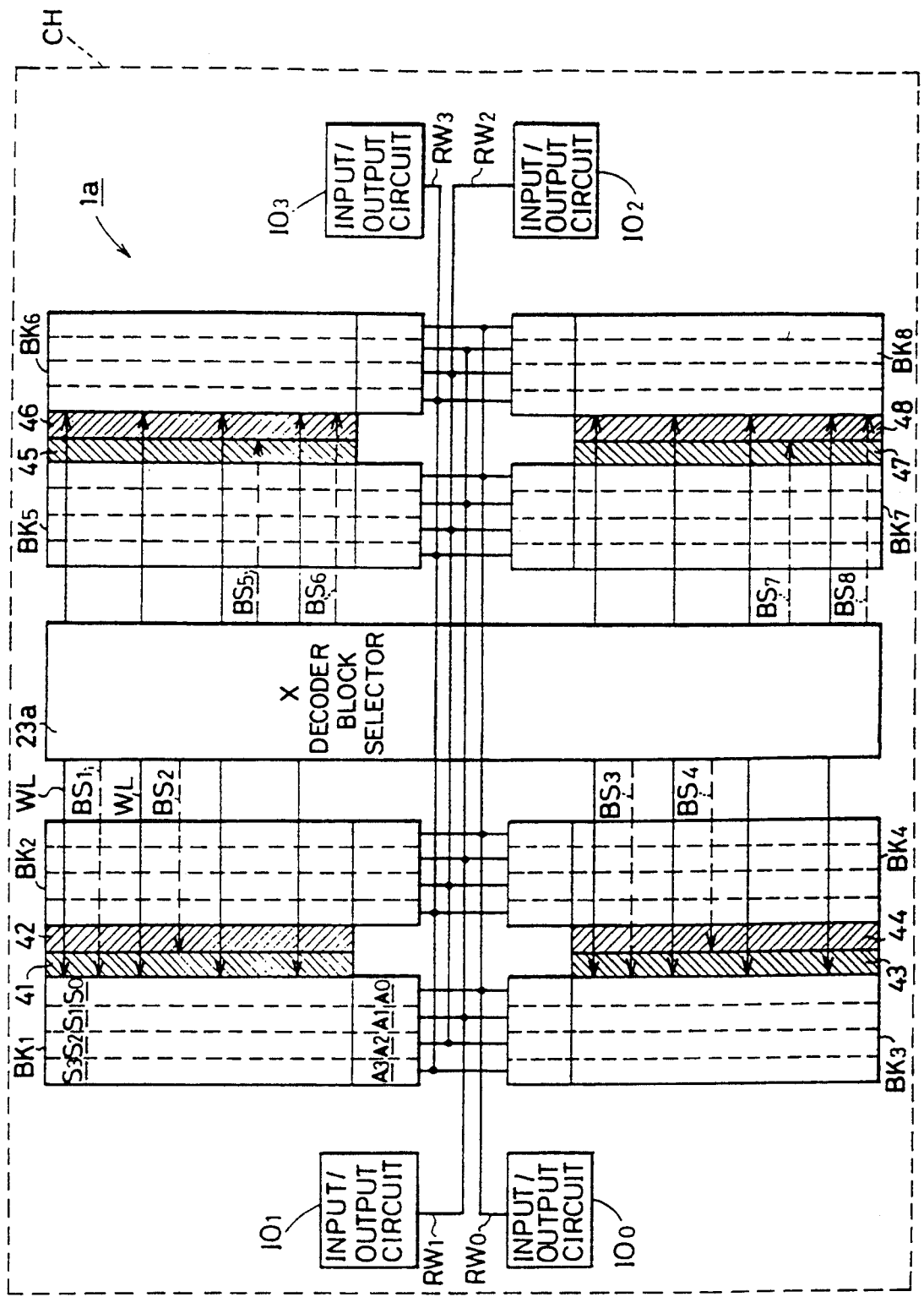
Figure 22:
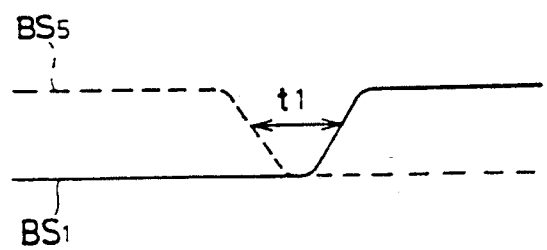
FIGS. 22 and 23 are waveform charts for showing the potential of the block selecting lines of the semiconductor memory devices of FIGS. 20 and 21.
Figure 23:
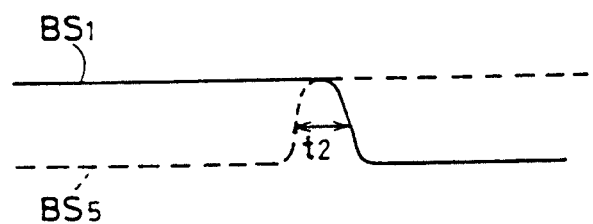

In sub-block 11a, a plurality of bit line pairs BL, $\overline{BL}$ are disposed to cross the plurality of local word lines LWL. Memory cells MC are provided at the intersections of the plurality of local word lines LWL and the plurality of bit line pairs BL, $\overline{BL}$. Each memory cell MC has a structure shown in FIGS. 14 or 15, for example.

Each bit line pair BL, $\overline{BL}$ is connected to a first voltage supply line V1 via bit line load transistors Q11, Q12. Each bit line pair BL, $\overline{BL}$ is connected to input/output line pair I/O, $\overline{I/O}$ via transfer gate transistors Q13, Q14. The Y decoder and the bit line selecting circuit are omitted in FIG. 3 to simplify the drawing. In practice, the Y decoder and the bit line selecting circuit are connected as in the structure of FIG. 13.

Read/write amplifying circuit 51a is connected to input/output line pair I/O, $\overline{I/O}$. Read/write amplifying circuit 51a comprises a local sense amplifier LSA and a write driver WD, similar to read/write amplifying circuit 50 of FIG. 13. Read/write amplifying circuit 51a is connected to read data buses Ra, Rb and write data buses Wa, Wb. Read data buses Ra, Rb and write data buses Wa, Wb form data bus RW0.

The read data bus may be implemented with one wiring, and the write data bus may be implemented with one wiring. Furthermore, a common data bus may be used for data reading and writing.

Figure 4:
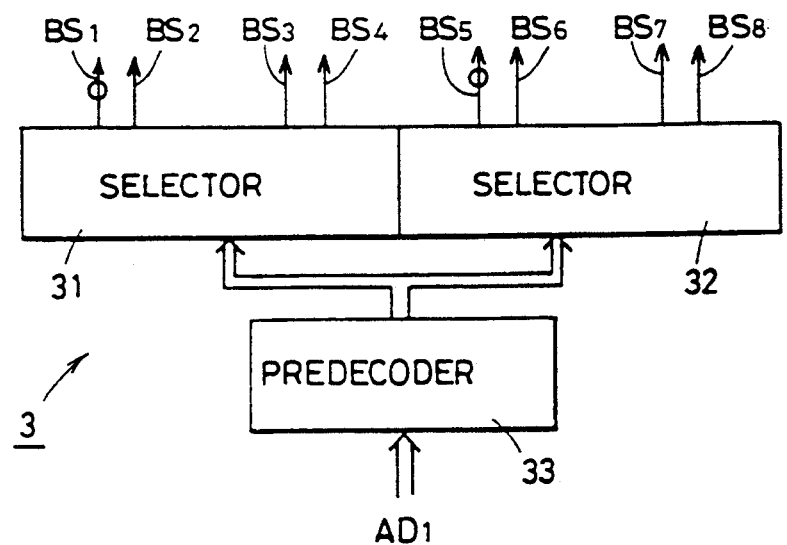
FIG. 4 is a block diagram showing an example of a structure of a block selector.

FIG. 4 is a diagram showing an example of a structure of block selector 3. Block selector 3 of FIG. 4 comprises two selectors 31 and 32 having the same structure, and a predecoder 33. The output terminal of selector 31 is connected to block selecting lines BS1–BS4. The output terminal of selector 32 is connected to block selecting lines BS5–BS8. Predecoder 33 receives an address signal AD1 to predecode that address signal AD1. The output of predecoder 33 is provided to both selectors 31 and 32. Therefore, the block selecting lines connected to the corresponding output terminals of selectors 31 and 32 are activated simultaneously. For example, block selecting line BS1 and BS5 indicated by a circle in FIG. 4 are activated simultaneously.

Figure 5:
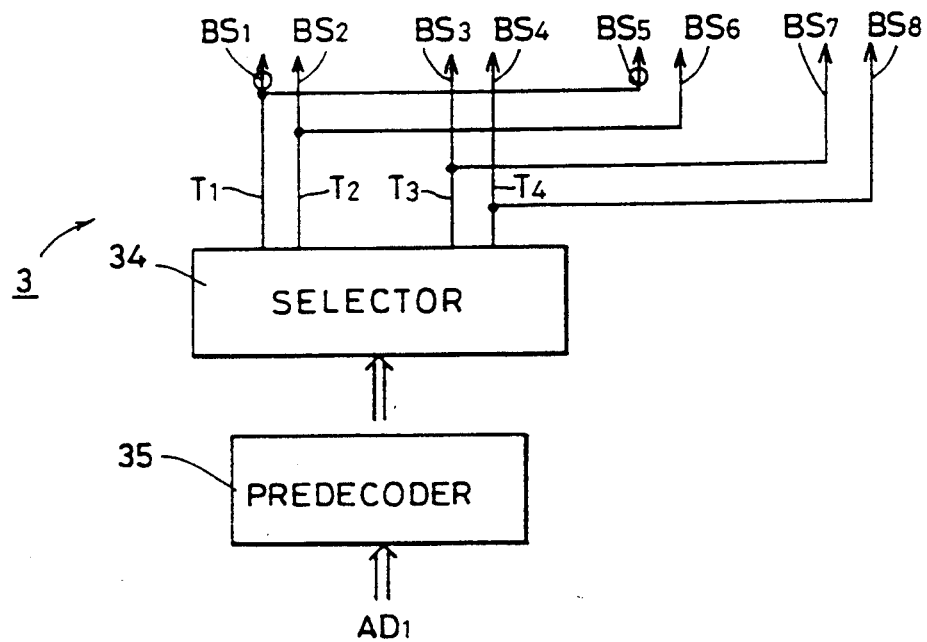
FIG. 5 is a block diagram showing another example of the structure of a block selector.

FIG. 5 is a block diagram showing another example of a structure of block selector 3. Block selector 3 of FIG. 5 comprises a selector 34 and a predecoder 35. Selector 34 has four output terminals T1–T4. Block selecting lines BS1 and BS5, block selecting lines BS2 and BS6, block selecting lines BS3 and BS7, and block selecting lines BS4 and BS8 are connected to output terminals T1, T2, T3, and T4, respectively.

Predecoder 35 receives address signal AD1 to predecode that address signal AD1. Selector 34 responds to the output of predecoder 35 to activate one of output terminals T1–T4. Accordingly, two block selecting lines are activated simultaneously. For example, block selecting lines BS1 and BS5 indicated by a circle in FIG. 5 are activated simultaneously.

Figure 6:
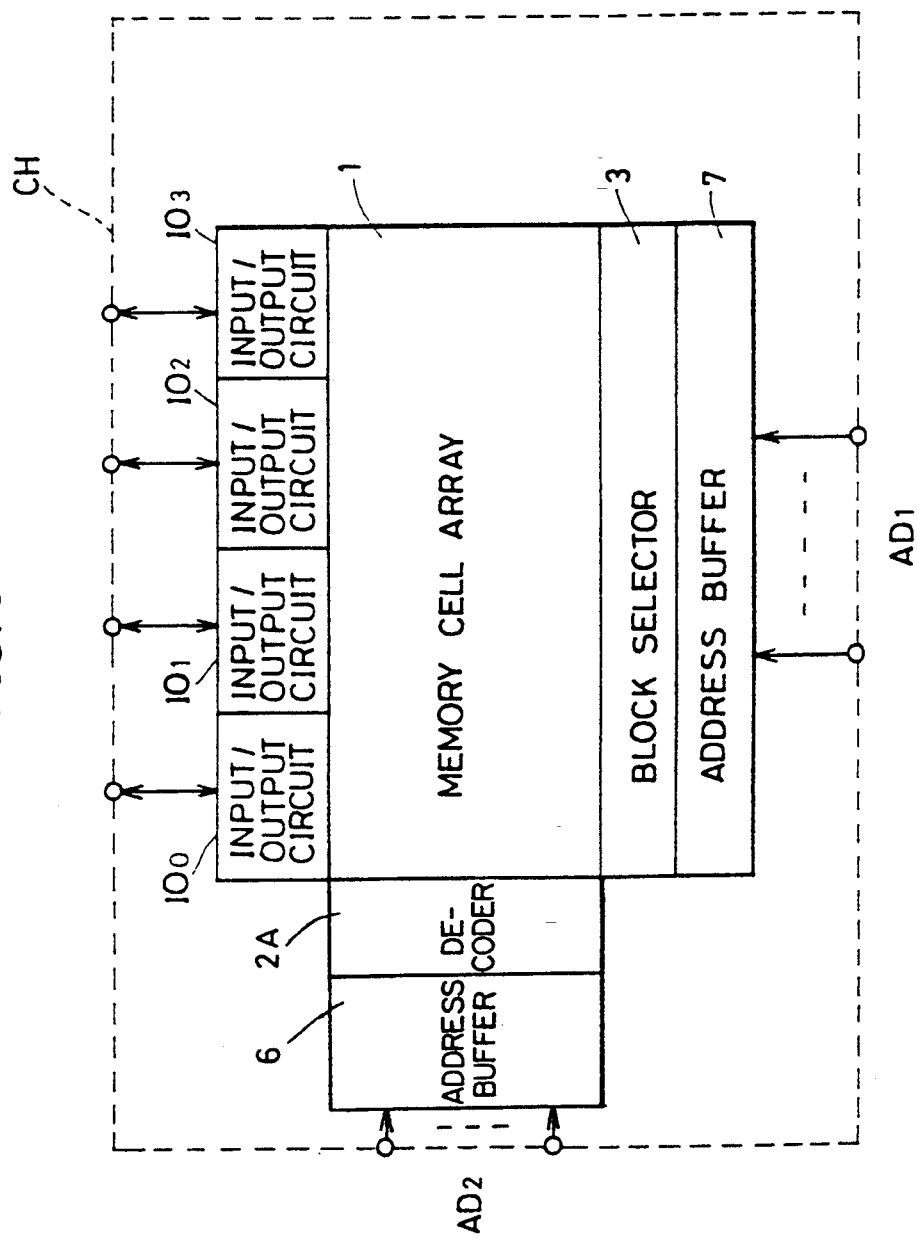
FIG. 6 is a block diagram showing an example of the structure of the entire semiconductor memory device of FIG. 1.

FIG. 6 is a diagram showing an example of a structure of the entire semiconductor memory device of the present embodiment. The semiconductor memory device of FIG. 6 carries out read/write operation of a 4-bit data internally and externally.

Referring to FIG. 6, an externally applied address signal AD1 is provided to block selector 3 via address buffer 7. An externally applied address signal AD2 is provided to decoder 2A via an address buffer 6. Decoder 2A comprises a X decoder and a Y decoder (refer to FIG. 13). The four input/output circuits IO0–IO3 are connected to four external terminals.

Figure 7:
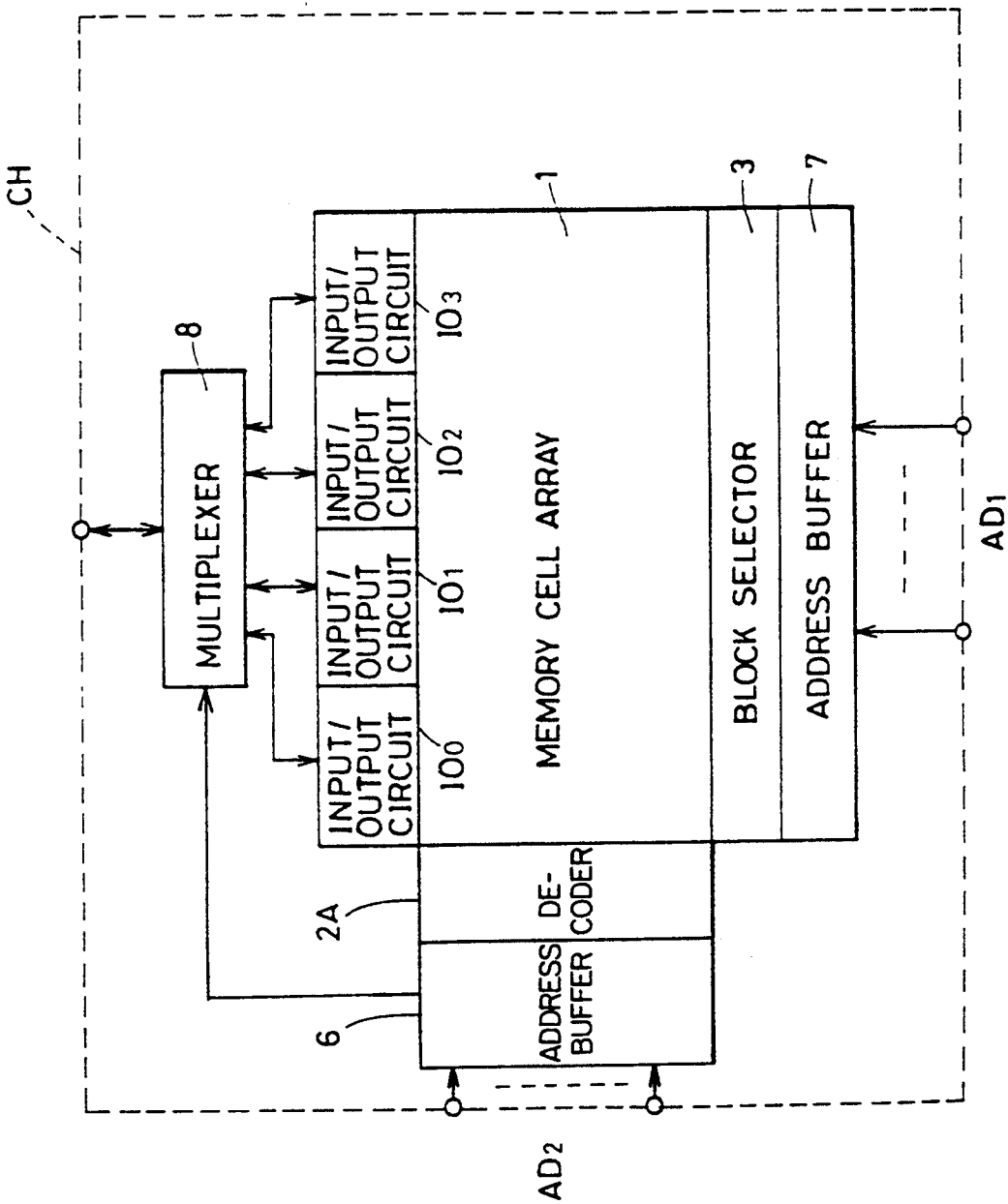
FIG. 7 is a block diagram showing another example of a structure of the entire semiconductor memory device of FIG. 1.

FIG. 7 is a block diagram showing another example of a structure of the entire semiconductor memory device of the present invention. The semiconductor memory device of FIG. 7 carries out read/write operation of a 4-bit data internally, and carries out read/write operation of a 1-bit data externally.

Referring to FIG. 7, the four input/output circuits IO0–IO3 are connected to a multiplexer 8. Multiplexer 8 is connected to one external terminal. Multiplexer 8 selects one bit of the data of 4 bits provided from the four input/output circuits IO0–IO3. The selected one bit is provided to the external terminal. Multiplexer 8 provides an externally applied 1 bit of data to one of the four input/output circuits IO0–IO3.

The operation of the semiconductor memory device of FIG. 1 will be explained hereinafter. Although the semiconductor memory device has memory cell array 1 divided into 8 blocks, the practical operation is similar to that of a memory cell array divided into 4 blocks.

Figure 13:
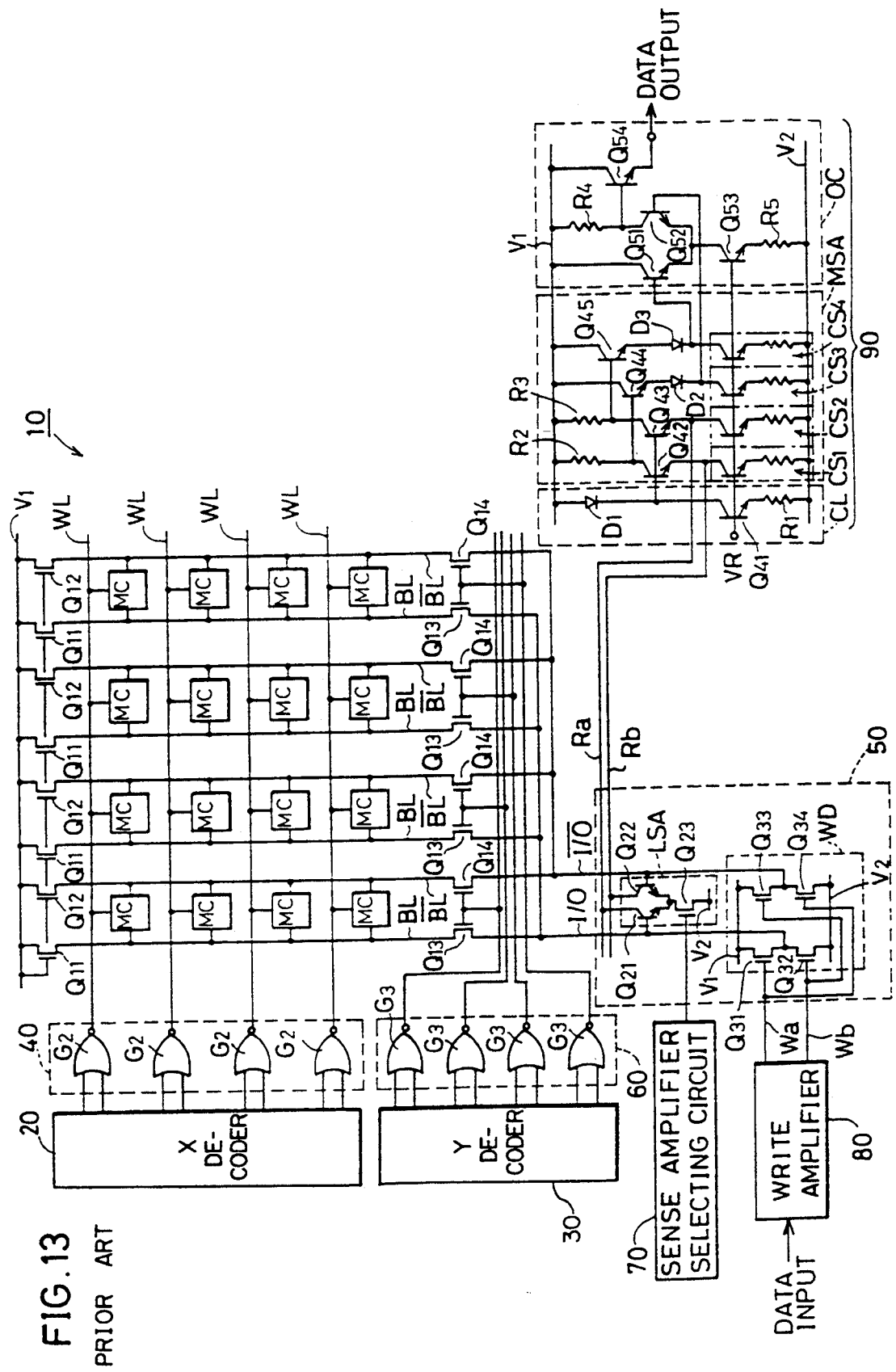
FIG. 13 is a circuit diagram showing a structure of the main components of a conventional SRAM.

The operation of the circuit of the Y address system is referred to that regarding FIG. 13, and will not be repeated.

Block selector 3 selects one of block selecting lines BS1–BS4, and one of block selecting lines BS5–BS8 simultaneously, to turn the potentials of the selected block selecting lines to a high level. X decoder 2 selects one of the plurality of main word lines WL to turn the potential of the selected main word line WL to a high level (refer to FIG. 2). This causes the potential of one local word line LWL in one of the blocks of BK1–BK4 to attain a high level, and the potential of one local word line LWL in one of blocks BK5–BK8 to attain a high level.

For example, when the potentials of block selecting lines BS1 and BS5 attain a high level at the same time, one local word line LWL in block BK1 and one local word line LWL in block BK5 attain a high level.

At this time, read/write amplifying circuits 51a, 51b, 55a and 55b are activated. The other read/write amplifying circuits 52a, 52b–54a, 54b, 56a, 56b–58a, 58b are not activated.

Referring to FIG. 2, the potential of block selecting line BS1 attains a high level, and one of the potentials of the plurality of main word lines WL attains a high level. This drives the potential of the local word line LWL connected to the corresponding AND gate G1 to a high level.

In FIG. 1, the reading/writing operation of data is carried out between read/write amplifying circuits 51a, 51b and input/output circuits IO0, IO1 via data buses RW0, RW1. Also, reading/writing operation of data is carried out between read/write amplifying circuits 55a, 55b and input/output circuits IO2, IO3 via data buses RW2, RW3.

Thus, the above described embodiment has the wiring length of data buses RW0–RW3 reduced to approximately a half of the longer side of chip CH. The wiring regions of data buses RW0, RW1 and data buses RW2, RW3 are provided in separate regions. This reduces the width of the wiring region.

Figure 8:
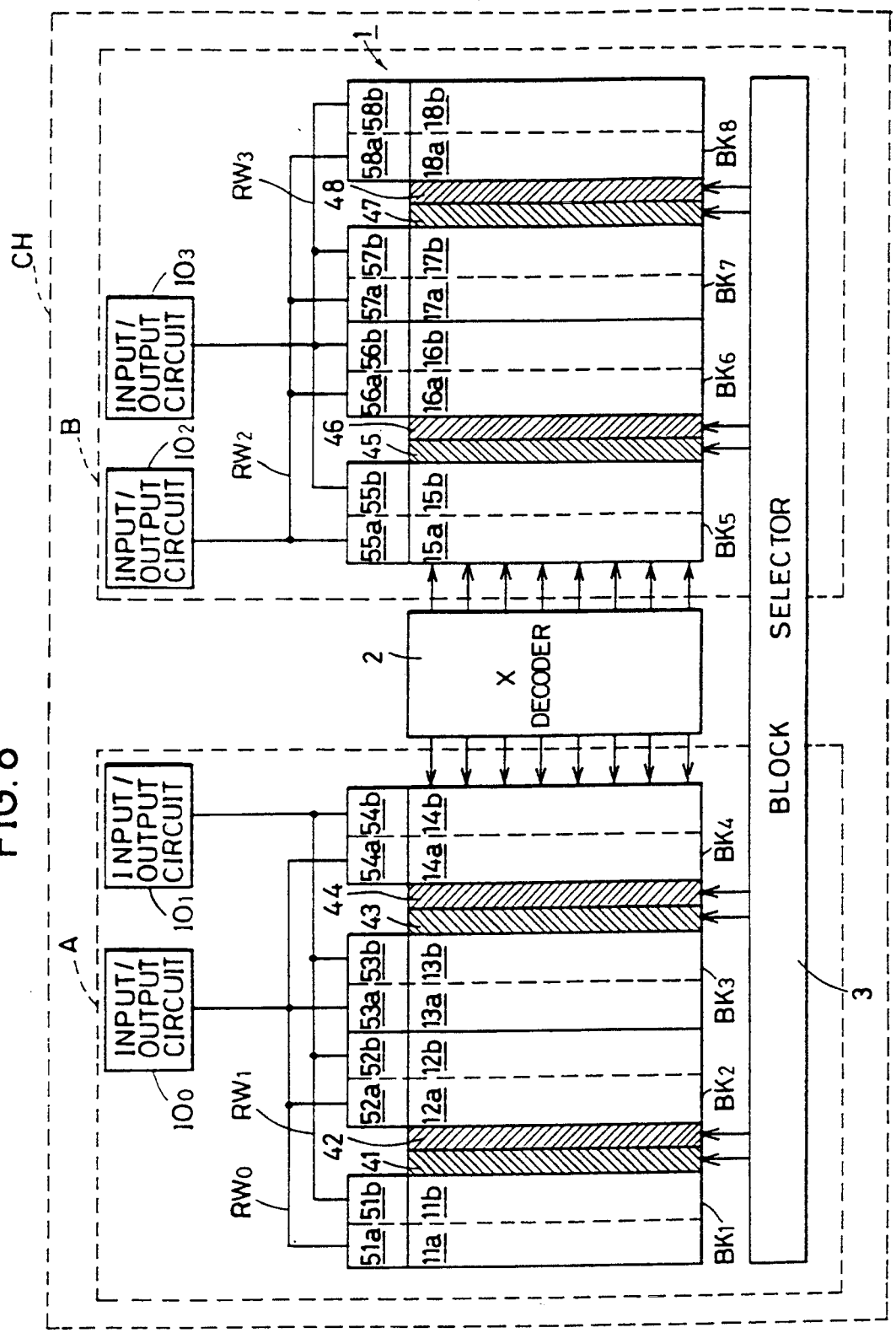
FIG. 8 is a block diagram showing a Structure of the main components of a semiconductor memory device according to a second embodiment of the present invention.

FIG. 8 is a block diagram showing a structure of the main components of a semiconductor memory device according to a second embodiment of the present invention.

The semiconductor memory device of FIG. 8 has X decoder 2 disposed between region A and region B on semiconductor chip CH. Blocks BK1–BK4 are disposed at one side of X decoder 2 and blocks BK5–BK8 disposed at the other side. Block selector 3 is disposed at one side end of memory cell array 1. The structures of the other components are similar to those of the semiconductor memory device of FIG. 1.

Figure 9:
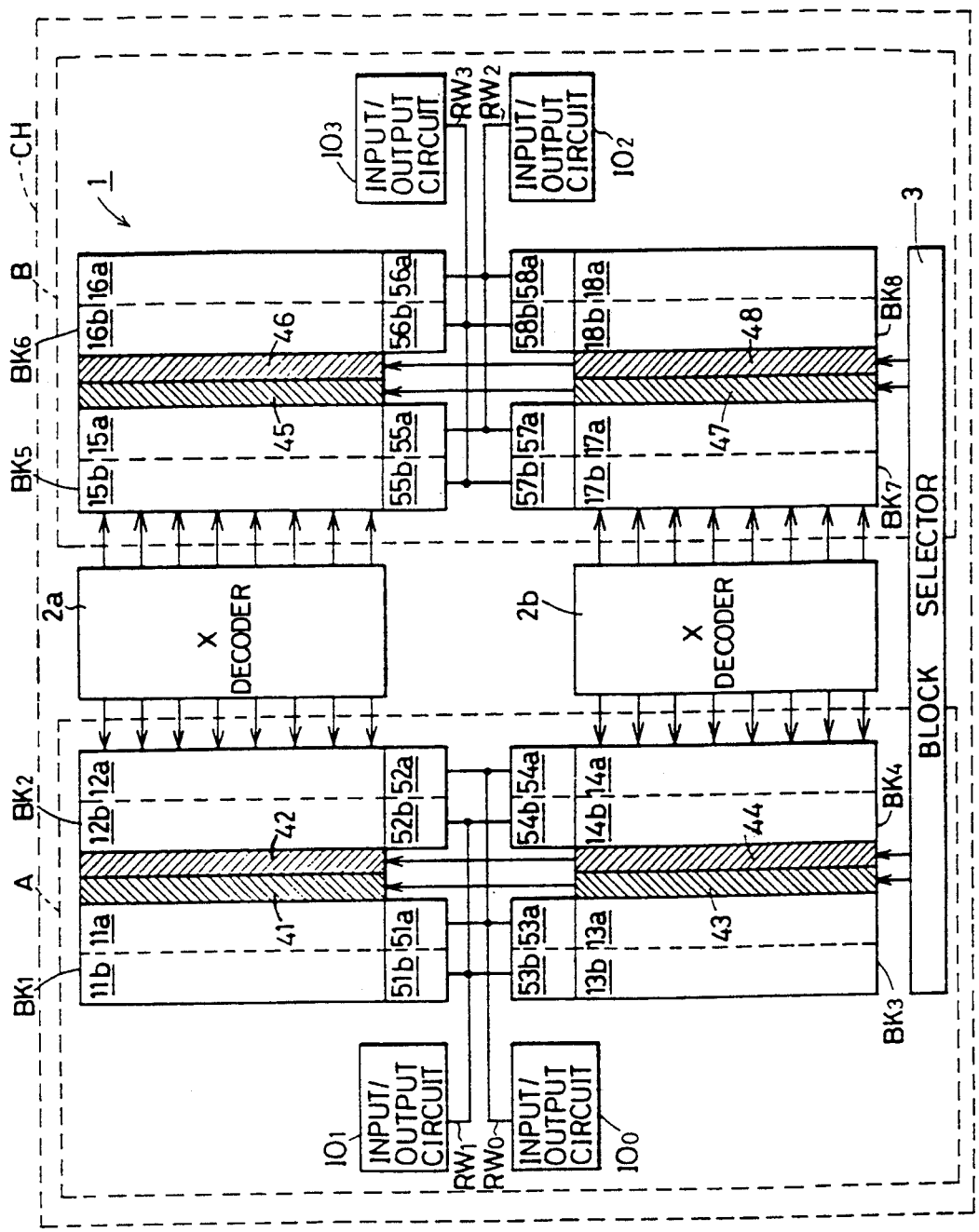
FIG. 9 is a block diagram showing a structure of the main components of a semiconductor memory device according to a third embodiment of the present invention.

FIG. 9 is a block diagram showing a structure of the main components of a semiconductor memory device according to a third embodiment of the present invention.

The semiconductor memory device of FIG. 9 has memory cell array 1 divided into two by having each bit line pair divided at its middle. X decoders 2a and 2b are provided between regions A and B on semiconductor chip CH. Blocks BK1, BK2 are disposed at one side of X decoder 2a, and blocks BK5, BK6 disposed at the other side. Blocks BK3, BK4 are disposed at one side of X decoder 2b, and blocks BK7, BK8 disposed at the other side. Block selector 3 is disposed at one side of memory cell array 1. Input/output circuits IO0, IO1 are disposed within region A, and input/output circuits IO2, IO3 are disposed within region B.

Input/output circuit IO0 is connected to read/write amplifying circuits 51a–54a via data bus RW0. Input/output circuit IO1 is connected to read/write amplifying circuits 51b–54b via data bus RW1. Input/output circuit IO2 is connected to read/write amplifying circuits 55a–58a via data bus RW2. Input/output circuit IO3 is connected to read/write amplifying circuits 55b–58b via data bus RW3. Block selector 3 is disposed at one side of memory cell array 1. The structures of the other components are similar to those of the semiconductor memory device of the FIG. 1.

Figure 10:
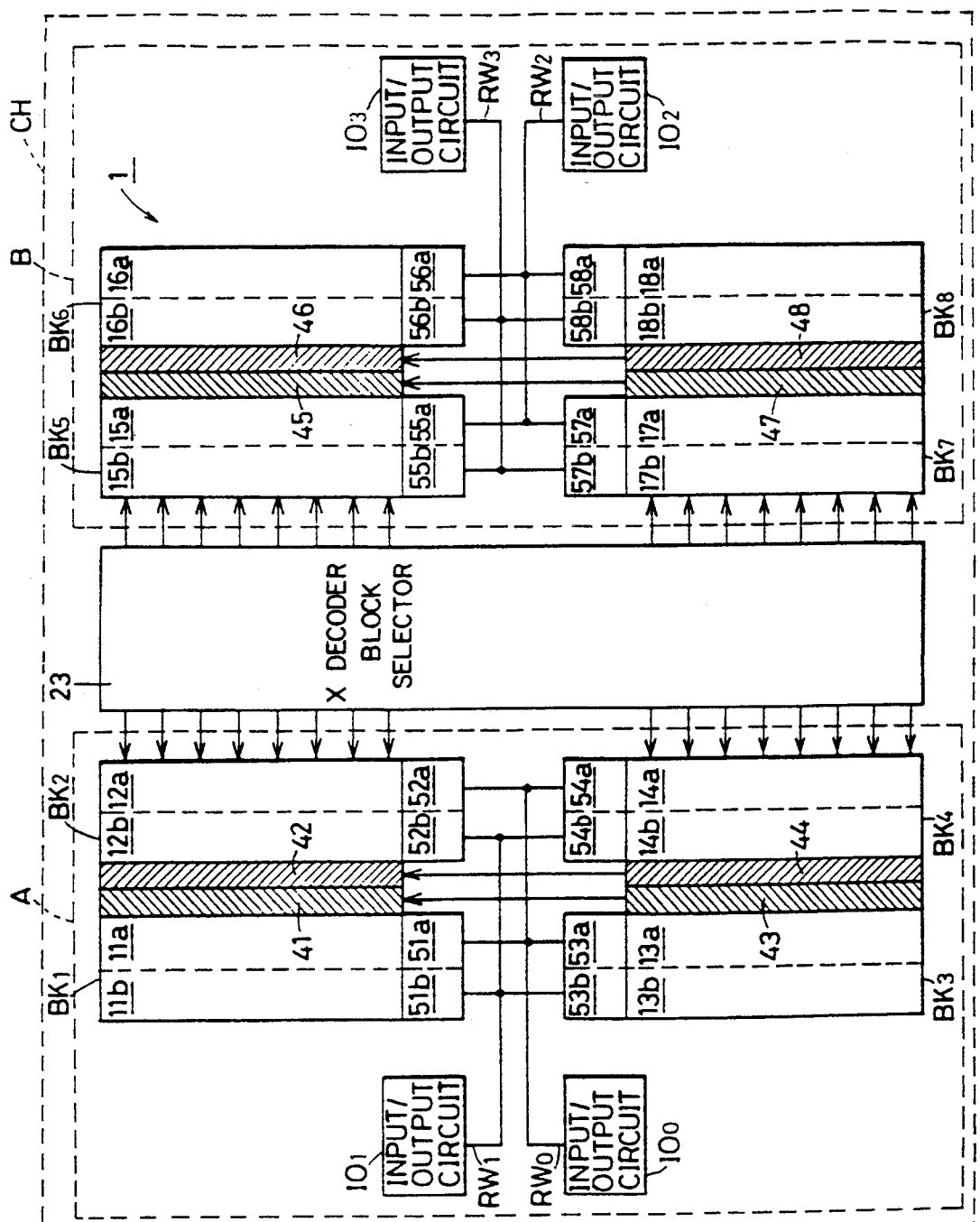
FIG. 10 is a block diagram showing a structure of the main components of a semiconductor memory device according to a fourth embodiment of the present invention.

FIG. 10 is a block diagram showing a structure of the main components of the semiconductor memory device according to a fourth embodiment of the present invention.

The semiconductor memory device of FIG. 10 has an X decoder·block selector 23 including an X decoder and a block selector disposed between regions A and B on chip CH. Similarly to the semiconductor memory device of FIG. 9, memory cell array 1 is divided into two by having each bit line pair divided at the middle. Blocks BK1–BK4 are disposed at one side of X decoder·block selector 23, and blocks BK5–BK8 disposed at the other side. The structures of the other components are similar to those of the semiconductor memory device of FIG. 9.

The arrangement of blocks BK1–BK8, the X decoder, and the block selector in the semiconductor memory devices of FIGS. 8–10 differ from that of the semiconductor memory device of the FIG. 1, while the operations are similar to that of the semiconductor memory device of FIG. 1.

Figure 11:
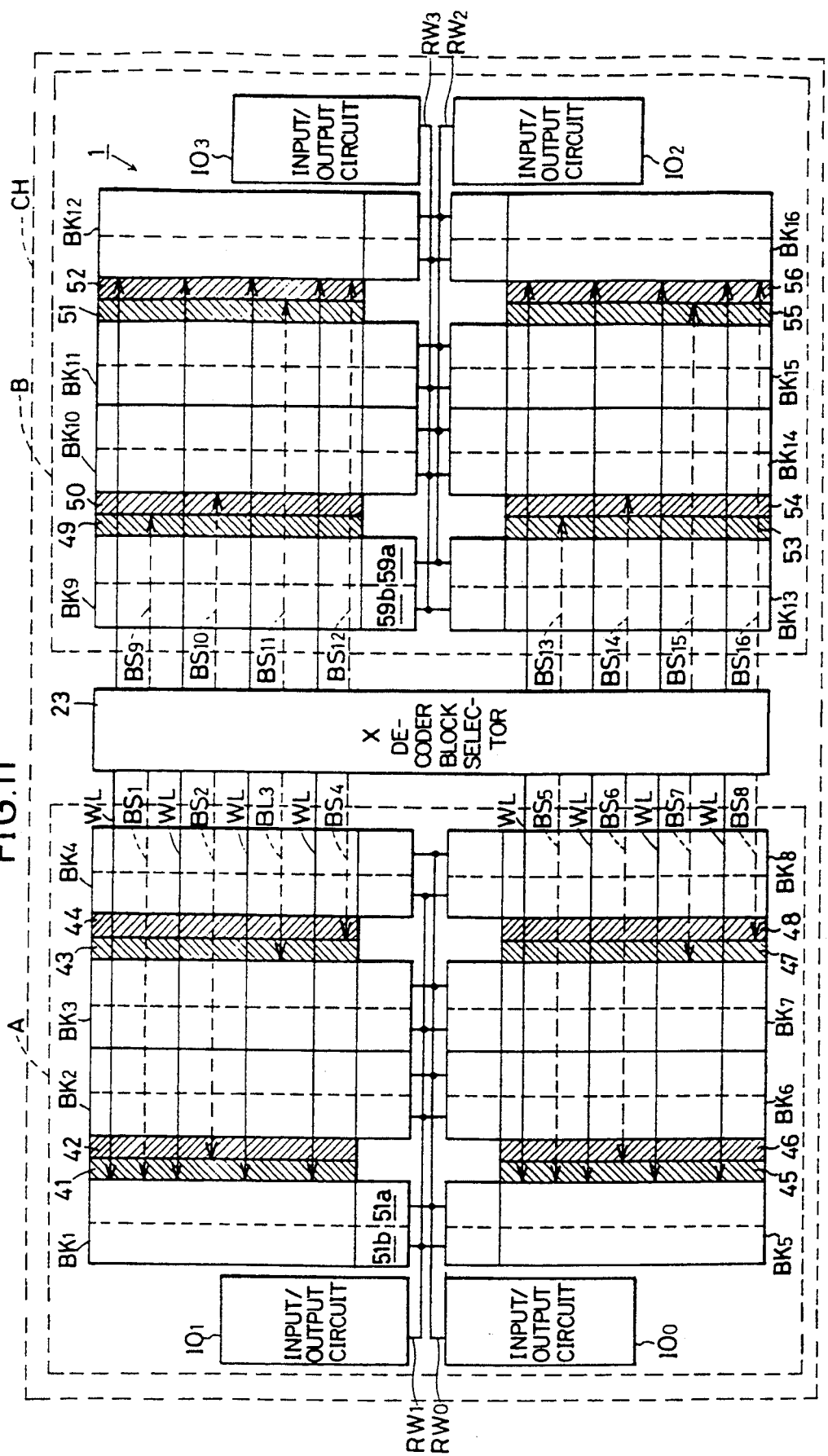
FIG. 11 is a block diagram showing a structure of the main components of a semiconductor memory device according to a fifth embodiment of the present invention.

FIG. 11 is a block diagram showing a structure of the main components of a semiconductor memory device according to a fifth embodiment of the present invention.

The semiconductor memory device of FIG. 11 has memory cell array 1 divided into 8 portions by dividing each word line, and also divided into two portions by dividing each bit line. Memory cell array 1 therefore comprises 16 blocks BK1–BK16. Blocks BK1–BK4, BK5–BK8 are disposed at one side of X decoder·block selector 23, and blocks BK9–BK12, BK13–BK16 are disposed at the other side. Read/write amplifying circuits 41–56 are provided corresponding to blocks BK1–BK16, respectively. Block selecting lines BS1–BS16 are connected between X decoder·block selector 23 and read/write amplifying circuits 41–56. Each block comprises two sub-blocks, similar to the semiconductor memory device of FIG. 10.

FIG. 12A shows X decoder·block selector 23 and block selecting lines BS1–BS4, BS9–BS12. Block selecting lines BS1 and BS9 are connected to each other. Block selecting line BS2 and BS10 are connected to each other. Block selecting lines BS3 and BS11 are connected to each other. Block selecting lines BS4 and BS12 are connected to each other. Assuming that the wiring length of block selecting lines BS1–BS4 are L1–L4, respectively, and the wiring length of block selecting lines BS9–BS12 are R1–R4, respectively, the following equation is established:

$$L1+R1=L2+R2=L3+R3=L4+R4=\text{constant}$$

The sum of the respective wiring length is similarly equal for block selecting line BS5–BS8, BS13–BS16.

The semiconductor memory device of FIG. 11 has a combination of the blocks driven by each output signal defined so that the sum of the wiring length up to each of the two blocks driven by the respective output signals of X decoder·block selector 23 are all equal.

For example, when the potential of output terminal T shown in FIG. 12A attains a high level, the potentials of block selecting lines BS1 and BS9 attain a high level. The potential of one of the plurality of main word lines WL disposed in blocks BK1-BK4, BK9-BK12 attains a high level. This turns the potentials of one local word line LWL in block BK1 and one local word line LWL in block BK9 to a high level. As a result, a plurality of memory cells connected to those local word lines LWL are selected.

At this time, read/write amplifying circuit 51a, 51b, 59a, 59b are activated. The other read/write amplifying circuits are not activated. As a result, reading/writing operation of data is carried out between input/output circuits IO0, IO1, IO2, IO3 and read/write amplifying circuits 51a, 52b, 59a, 59b via read buses RW0, RW1, RW2, and RW3.

As described in the foregoing, the semiconductor memory device of FIG. 11 can have the wiring length of the block selecting lines be made equal for activating simultaneously two blocks of the plurality of blocks BK1-BK16. This will eliminate difference in load capacitance due to difference in wiring length, whereby difference in delay time of a signal can be avoided. The time period where no memory cell in all word lines is selected will be eliminated. The double or multi-selection event is also eliminated. As a result, erroneous writing of data and increase in access time are prevented.

Because the semiconductor memory device of FIG. 11 has data buses RW0-RW3 allocated to two regions A and B, reduction in the wiring length and wiring region of the data buses are realized simultaneously, similar to the semiconductor memory device of FIG. 1.

Although memory cell array 1 is divided into two in the middle of each bit line pair in the embodiment of FIG. 11, the present invention is applicable to a semiconductor memory device having a memory cell array that is not divided in the above-described manner.

The semiconductor memory device of FIG. 10 may have equal wiring length of block selecting lines for activating two blocks simultaneously out of the plurality of blocks BK1-BK8. In this case, an effect similar to that of the semiconductor memory device of FIG. 11 can be obtained.

Figure 12B:
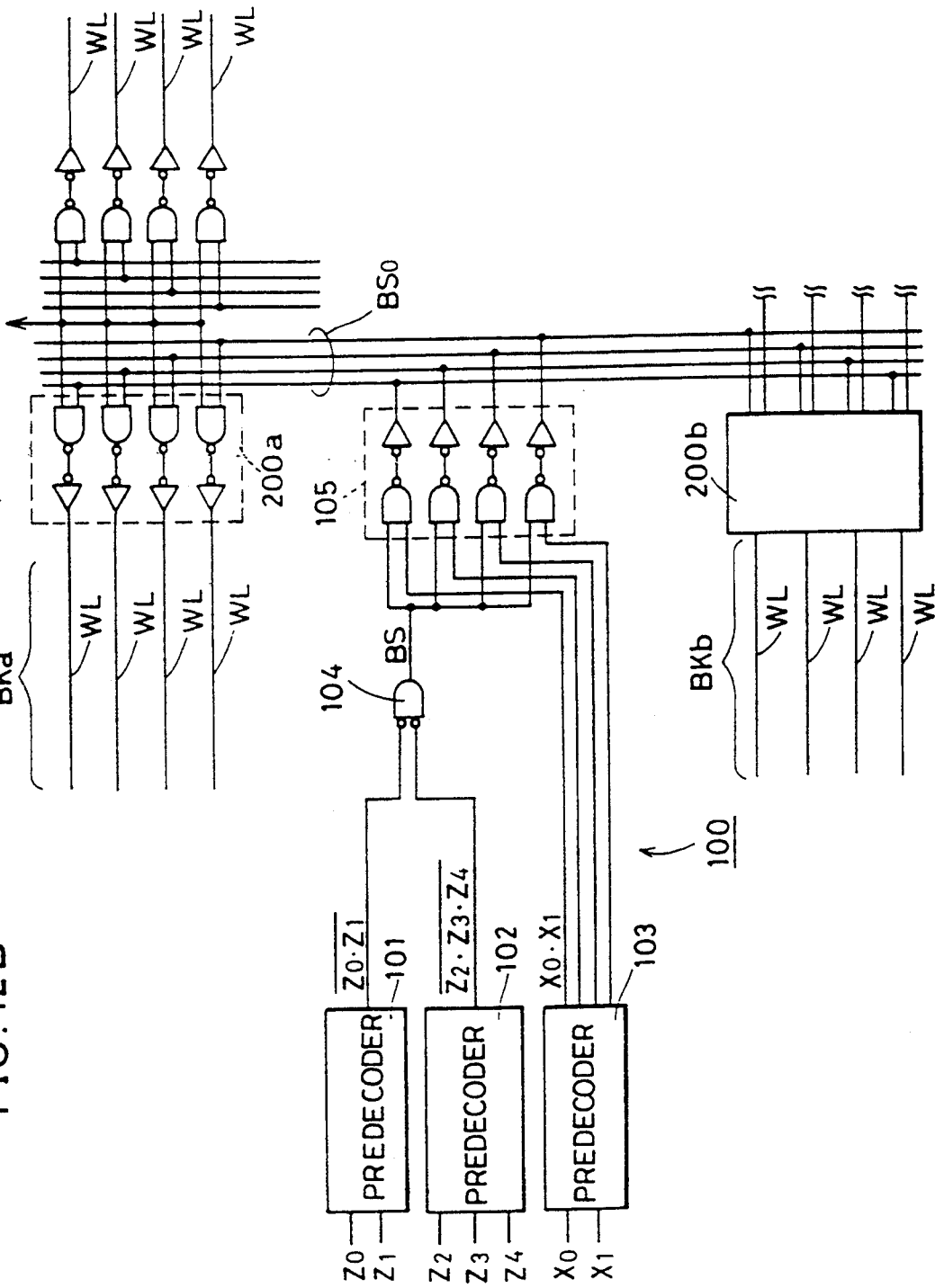
FIG. 12B is a diagram showing a block selecting line formed of a plurality of signal lines.

Each block selecting line selecting two blocks simultaneously may be implemented with a plurality of signal lines, as shown in FIG. 12B. The structure of FIG. 12B is shown in IEEE Journal of Solid-State Circuits Vol. 23, No. 5, pp. 1060-1066, Oct. 1988.

Referring to FIG. 12B, one block selecting line BS0 is formed by four signal lines. Two word line selecting circuits 200a and 200b corresponding to two blocks BKa and BKb are connected to block selecting line BS0. Block selector 100 comprises predecoders 101, 102, 103, and an NOR gate 104. Address signals Z0-Z4 are predecoded by predecoders 101 and 102. A block selecting signal BS is provided from NOR gate 104. Address signals X0 and X1 are predecoded by predecoder 103. Selecting circuit 105 selects one signal line in block selecting line BS0 according to block selecting circuit BS and the output of predecoder 103. This selects respective one word lines WL in blocks BKa and BKb.

The semiconductor memory device having a block selecting lines as shown in FIG. 12B may have equal length of each block selecting line by arranging the blocks and the connection of the block selecting lines as shown in FIG. 11. An effect similar to that of the semiconductor memory device of FIG. 11 can be obtained.

Although each word line selecting circuit is formed of a plurality of AND gates as shown in FIG. 2 in the above described embodiment, each word line selecting circuit may be formed of an NOR gate, for example. In this case, the potential of the corresponding local word line LWL is driven to a high level when the potential of the corresponding block selecting line is at a low level and the potential of the corresponding main word line WL is at a low level.

The arrangement of the plurality of blocks, the X decoder, the block selector, and the input/output circuits are not limited to the above described arrangements, and various modifications are allowed. If the plurality of data buses are allocated to a plurality of regions, and if a plurality of blocks arranged in the plurality of regions are activated simultaneously, an effect similar to those of the above described embodiments can be obtained.

The present invention is not limited to a SRAM applying the Bi-CMOS technique, for example, and is applicable to other semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which reading/writing operation of data of a plurality of bits is carried out internally, said semiconductor memory device being substantially rectangular with a length in a first direction and a width in a second direction, at right angles with said first direction, and including a first region and a second region arranged along said first direction, comprising:
   a first set of a plurality of memory array blocks provided in said first region and being arranged in first and second rows along said first direction, each memory array blocks comprising one or more sub-blocks,
   a second set of a plurality of memory array blocks provided in said second region and being arranged in first and second rows along said first direction, each memory array blocks comprising one or more sub-blocks,
   a first set of one or more input/output means provided in said first region, for input/output of data of a plurality of bits, and connected to said one or more sub-blocks included in each of said first set of a plurality of memory array blocks in the first region,
   a second set of one or more input/output means provided in said second region for input/output of data of a plurality of bits and connected to said one or more sub-blocks included in each of said second set of a plurality of memory array blocks in the second region,
   a first set of one or more data buses provided in said first region, each of said first set of one or more data buses being connected between the corresponding input/output means in said first region and the corresponding sub-blocks in said first region, a second set of one or more data buses provided in said second region, each of said second set of one or more data buses being connected between the corresponding input/output means in said second region and the corresponding sub-blocks in said second region, block selecting means for selecting simultaneously one of said plurality of memory array blocks in each of said first and second regions for reading/writing of said data of a plurality of bits, and being arranged along said first direction at one side of said first and second rows of the plurality of memory array blocks, a first set of a plurality of main word lines extending along said first direction in said first row of memory array blocks, each main word line commonly provided to said first row of memory array blocks of each region, a second set of a plurality of main word lines extending along said first direction in said second row of memory array blocks, each main word line commonly provided to said second row of memory array blocks of each region, first main word line selecting means for selecting one of said first set of main word lines and being arranged along said second direction and positioned between said first and second regions, and second main word line selecting means for selecting one of said second set of main word lines and being arranged along said second direction and positioned between said first and second regions.

2. A semiconductor memory device in which reading/writing operation of data of a plurality of bits is carried out internally, said semiconductor memory device being substantially rectangular with a length in a first direction and a width in a second direction, at right angles with said first direction, and including a first region and a second region arranged along said first direction, comprising:

a first set of a plurality of memory array blocks provided in said first region and being arranged in first and second rows along said first direction, each memory array blocks comprising one or more sub-blocks, a second set of a plurality of memory array blocks provided in said second region and being arranged in first and second rows along said first direction, each memory array blocks comprising one or more sub-blocks, a first set of one or more input/output means provided in said first region, for input/output of data of a plurality of bits, and connected to said one or more sub-blocks included in each of said first set of a plurality of memory array blocks in the first region, a second set of one or more input/output means provided in said second region for input/output of data of a plurality of bits and connected to said one or more sub-blocks included in each of said second set of a plurality of memory array blocks in the second region, a first set of one or more data buses provided in said first region, each of said first set of one or more data buses being connected between the corresponding input/output means in said first region and the corresponding sub-blocks in said first region, a second set of one or more data buses provided in said second region, each of said second set of one or more data buses being connected between the corresponding input/output means in said second region and the corresponding sub-blocks in said second region, block selecting means for selecting simultaneously one of said plurality of memory array blocks in each of said first and second regions for reading/writing of said data of a plurality of bits, a first set of a plurality of main word lines extending along said first direction in said first row of memory array blocks, each main word line commonly provided to said first row of memory array blocks of each region, a second set of a plurality of main word lines extending along said first direction in said second row of memory array blocks, each main word line commonly provided to said second row of memory array blocks of each region, and main word line selecting means for selecting one of said first set of main word lines and one of said second set of main word lines, wherein said main word line selecting means and said block selecting means are arranged along said second direction and positioned between said first and second regions.

3. A semiconductor memory device in which reading/writing operation of data of a plurality of bits is carried out internally, said semiconductor memory device being substantially rectangular with a length in a first direction and a width in a second direction, at right angles with said first direction, and including a first region and a second region arranged along said first direction, comprising:

a first set of a plurality of memory array blocks provided in said first region and being arranged in first and second rows along said first direction, each memory array block comprising one or more sub-blocks, a second set of a plurality of memory array blocks provided in said second region and being arranged in first and second rows along said first direction, each memory array block comprising one or more sub-blocks, a first set of one or more input/output means provided in said first region, for input/output of data of a plurality of bits, and connected to said one or more sub-blocks included in each of said first set of a plurality of memory array blocks in the first region, a second set of one or more input/output means provided in said second region for input/output of data of a plurality of bits and connected to said one or more sub-blocks included in each of said second set of a plurality of memory array blocks in the second region, a first set of one or more data buses provided in said first region, each of said first set of one or more data buses being connected between the corresponding input/output means in said first region and the corresponding sub-blocks in said first region, a second set of one or more data buses provided in said second region, each of said second set of one or more data buses being connected between the corresponding input/output means in said second region and the corresponding sub-blocks in said second region, block selecting means for selecting simultaneously one of said plurality of memory array blocks in each of said first and second regions for reading/writing of said data of a plurality of bits, a first set of a plurality of main word lines extending along said first direction in said first row of memory array blocks, each main word line commonly provided to said first row of memory array blocks of each region, a second set of a plurality of main word lines extending along said first direction in said second row of memory array blocks, each main word line commonly provided to said second row of memory array blocks of each region, main word line selecting means for selecting one of said first set of main word lines and one of said second set of main word lines, and a plurality of block selecting lines for transmitting an output from said block selecting means to said plurality of memory array blocks provided in said first region and in said second region, wherein said main word line selecting means and said block selecting means are arranged along said second direction and positioned between said first and second regions, and each block selecting line is connected between one of said plurality of memory array blocks provided in said first region and one of said plurality of memory array blocks provided in said second region through said block selecting means, so that the length of each of said plurality of block selecting lines are nearly equal to each other.

* * * * *